(12) United States Patent
Chiu

(10) Patent No.: US 12,394,662 B2
(45) Date of Patent: Aug. 19, 2025

(54) METHOD FOR PATTERNING ACTIVE AREAS COMPRISING DIFFERENT OPERATIONS IN SEMICONDUCTOR STRUCTURE

(71) Applicant: NANYA TECHNOLOGY CORPORATION, New Taipei (TW)

(72) Inventor: Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 419 days.

(21) Appl. No.: 18/097,336

(22) Filed: Jan. 16, 2023

(65) Prior Publication Data

US 2024/0243003 A1 Jul. 18, 2024

(51) Int. Cl.
  *H01L 21/762* (2006.01)
  *H01L 21/027* (2006.01)
  *H01L 21/308* (2006.01)
  *H01L 21/311* (2006.01)

(52) U.S. Cl.
  CPC .... *H01L 21/76224* (2013.01); *H01L 21/0274* (2013.01); *H01L 21/3086* (2013.01); *H01L 21/31144* (2013.01)

(58) Field of Classification Search
  CPC ........... H01L 21/0274; H01L 21/31144; H01L 21/3086; H01L 21/76224; H01L 21/0271
  USPC ........................................................ 438/673
  See application file for complete search history.

(56) References Cited

U.S. PATENT DOCUMENTS

| 2006/0024893 | A1 | 2/2006 | Min et al. |
| 2008/0085612 | A1 | 4/2008 | Smythe et al. |
| 2015/0056814 | A1* | 2/2015 | Ling ................. H01L 21/31116 438/705 |
| 2019/0079384 | A1* | 3/2019 | Chan ..................... G03F 7/2002 |
| 2020/0013631 | A1* | 1/2020 | Borna Tutuc ....... H01L 21/3081 |

(Continued)

FOREIGN PATENT DOCUMENTS

| TW | 200839426 A | 10/2008 |
| TW | 202218060 A | 5/2022 |

OTHER PUBLICATIONS

Office Action and and the search report mailed on Dec. 19, 2023 related to Taiwanese Application No. 112119185.

(Continued)

*Primary Examiner* — Didarul A Mazumder
(74) *Attorney, Agent, or Firm* — Xuan Zhang

(57) ABSTRACT

A method for manufacturing a semiconductor structure is provided. A first mask layer and a photoresist layer are formed over a substrate, wherein photosensitivities of the photoresist layer and the first mask layer are different. A first and a second opening are formed, wherein the first mask layer overlapped by the second opening is degraded to form a second mask layer. The substrate exposed by the first opening is partially removed to form a first recess of the substrate. The second mask layer is removed to form a third opening through the first mask layer. A first dielectric layer is formed, wherein the first dielectric layer fills the first recess and the third opening and covers the substrate overlapped by the third opening. A patterning operation is performed on the substrate using the first dielectric layer as a mask, and a second recess of the substrate is thereby formed.

20 Claims, 44 Drawing Sheets

(56) References Cited

U.S. PATENT DOCUMENTS

2022/0238349 A1* 7/2022 Nagabhirava ..... H01L 21/31144
2022/0392765 A1* 12/2022 Han ................. H01L 21/02118

OTHER PUBLICATIONS

Office Action and and the search report mailed on Sep. 25, 2024 related to Taiwanese Application No. 113104441.

* cited by examiner

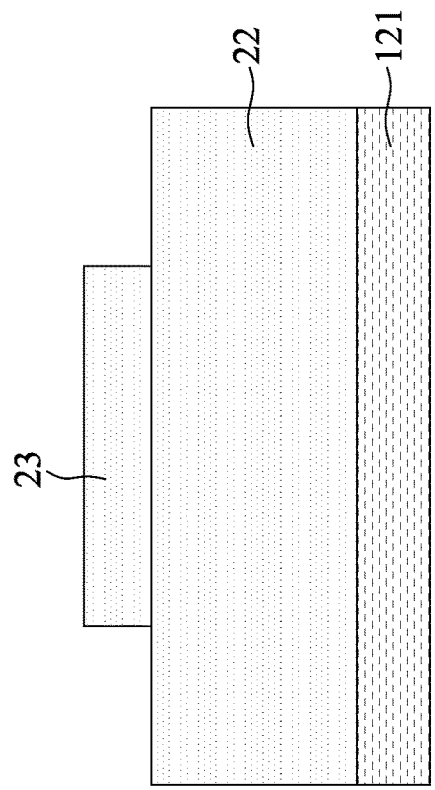
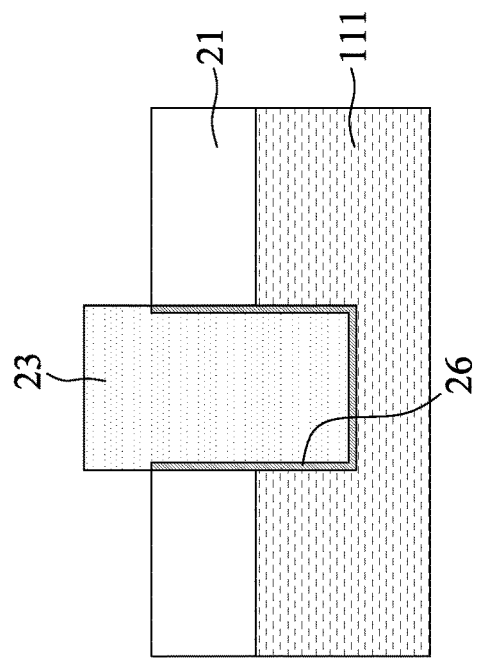
FIG. 17B
FIG. 17A

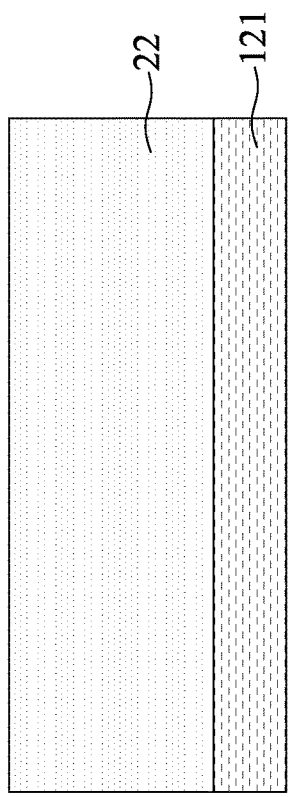
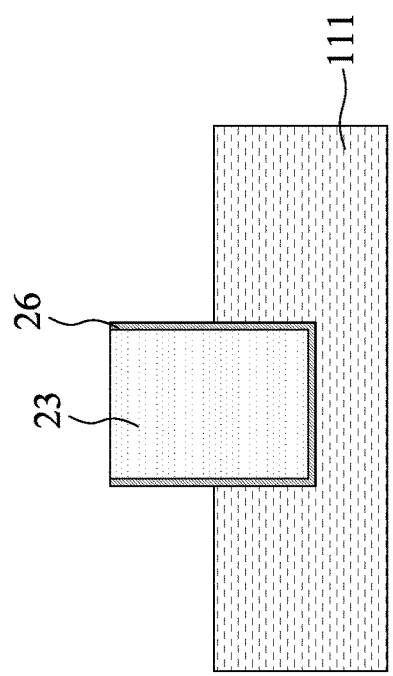
FIG. 22B
FIG. 22A

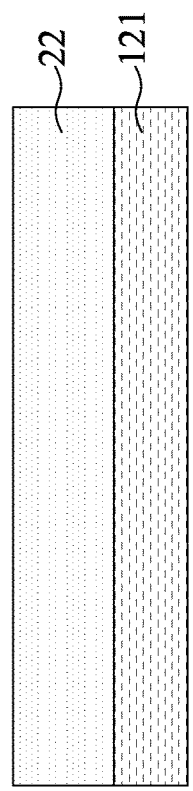
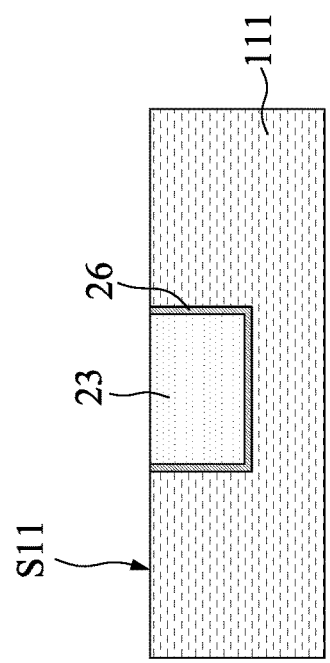
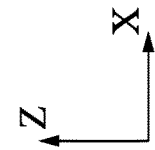
FIG. 24A
FIG. 24B

METHOD FOR PATTERNING ACTIVE AREAS COMPRISING DIFFERENT OPERATIONS IN SEMICONDUCTOR STRUCTURE

TECHNICAL FIELD

The present disclosure relates to a method for manufacturing a semiconductor structure. Particularly, the present disclosure relates to a patterning method applied in formation of a semiconductor structure.

DISCUSSION OF THE BACKGROUND

Semiconductor devices are used in a variety of electronic applications, such as personal computers, cellular phones, digital cameras, and other electronic equipment. As the semiconductor industry has progressed into advanced technology process nodes of semiconductor devices in pursuit of greater device density, dimensions of elements on a semiconductor substrate are reduced, and challenges of patterning such elements (e.g., active areas) with reduced sizes have arisen.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a method for forming a semiconductor structure. The method may include multiple operations or steps. A first mask layer is formed over a substrate. A photoresist layer is formed over the first mask layer, wherein a photosensitivity of the photoresist layer is different from a photosensitivity of the first mask layer. A first opening penetrating the photoresist layer and the first mask layer and a second opening partially penetrating the photoresist layer are formed, wherein a portion of the first mask layer overlapped by the second opening is degraded to form a second mask layer. A portion of the substrate exposed by the first opening is partially removed to form a first recess of the substrate. The second mask layer is removed to form a third opening through the first mask layer. A first dielectric layer is formed, wherein the first dielectric layer fills the first recess and the third opening and covers a portion of the substrate overlapped by the third opening. A patterning operation is performed on the substrate using the first dielectric layer as a mask, and a second recess of the substrate is thereby formed.

Another aspect of the present disclosure provides a method for manufacturing a semiconductor structure. The method may include multiple operations or steps. A substrate is provided, wherein the substrate includes a first protruding portion and a second protruding portion substantially parallel to each other and extending along a first direction. The first protruding portion and the second protruding portion are covered by a first dielectric layer. A first mask layer is formed over the first dielectric layer, and a photoresist layer is formed over the first mask layer. A patterning operation is performed, wherein a first opening exposing the first dielectric layer is formed in the photoresist layer and the mask layer and over the first protruding portion, and a second opening is formed partially through the photoresist layer and over the second protruding portion. A chemical property of a portion of the first mask layer overlapped by the second opening is changed during the patterning operation, and a second mask layer overlapped by the second opening is thereby defined. A first recess of the first protruding portion is formed using the photoresist layer as a mask. A portion of the second protruding portion not overlapped by the second mask layer is partially removed, and a second recess of the second protruding portion is thereby formed.

Another aspect of the present disclosure provides a method for manufacturing a semiconductor structure. The method includes a number of operations or steps. A substrate is provided, wherein the substrate includes a first protruding portion and a second protruding portion, wherein the first and second protruding portions extend along a first direction. A patterned photosensitive layer is formed, wherein the patterned photosensitive layer includes a first through hole over the first protruding portion and a recess over the second protruding portion, wherein the first through hole and the recess are connected along a second direction substantially orthogonal to the first direction, and a width of the first through hole is less than a width of the recess. A portion of the substrate exposed by the first through hole is partially removed, and a first opening of the substrate is thereby formed. A first dielectric layer lining the first opening is formed. A portion of the patterned photosensitive layer below the recess is removed, and a second through hole is thereby formed. A second dielectric layer surrounded by the first dielectric layer and disposed within the second through hole is formed. The substrate is patterned using the second dielectric layer as a mask.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

FIGS. 9A, 10A, 11A, 12A, 13A, 14A, 15A, 16A, 17A, 19A, 20A, 21A, 22A and 24A are schematic cross-sectional diagrams along a line A-A' in FIG. 8 at different stages of the method in accordance with some embodiments of the present disclosure.

FIGS. 9B, 10B, 11B, 12B, 13B, 14B, 15B, 16B, 17B, 19B, 20B, 21B, 22B and 24B are schematic cross-sectional diagrams along a line B-B' in FIG. 8 at different stages of the method in accordance with some embodiments of the present disclosure.

DETAILED DESCRIPTION

Figure 1:
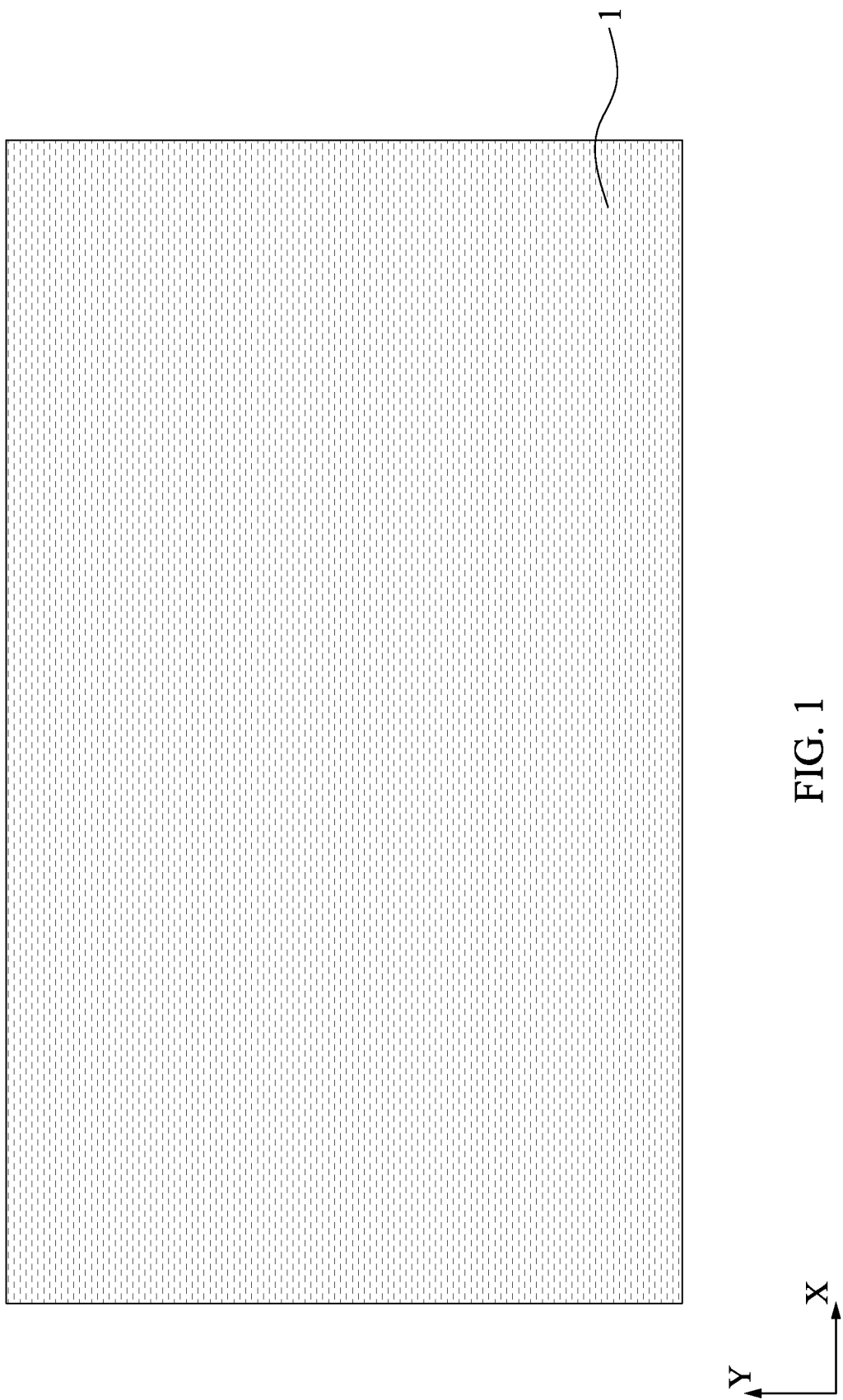
FIG. 1 is a schematic top-view diagram of a substrate in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Due to a tendency of shrinkage in sizes of semiconductor devices, a dimension of active areas may be so small that a precise definition of the active areas is hard to achieve by electron beam lithography (EBL). With the birth of extreme ultraviolet lithography (EUVL), patterns with dimensions less than 37 nanometers (nm) can be achieved. However, equipment and processes of EUVL are expensive, and its use results in increased process and product costs.

The present disclosure provides a method for forming multiple active areas on a substrate using EBL. Photosensitive materials with different photosensitivities are used to define active areas arranged in different rows, and a smaller dimension (e.g., a pattern having a width or a length less than 37 nm) can be achieved.

Schematic diagrams of a substrate at different stages of the method of the present disclosure are provided in the figures in accordance with some embodiments, and descriptions of the figures are provided in the following paragraphs to illustrate the concept of the present disclosure.

Referring to FIG. 1, a substrate 1 is provided, formed or received. The substrate 1 may include semiconductive material. In some embodiments, the substrate 1 include a material selected from III-V groups on the periodic table. In some embodiments, the substrate 1 is a bulk semiconductor, a semiconductor-on-insulator (SOI) substrate, or the like. The substrate 1 may be of a first conductivity type, e.g., a P-type semiconductive substrate (acceptor type), or of a second conductivity type, e.g., an N-type semiconductive substrate (donor type). In some embodiments, the substrate 1 may include a doped epitaxial layer, a gradient semiconductor layer, or a semiconductor layer overlaying another semiconductor layer of a different type, such as a silicon layer on a silicon germanium layer.

Figure 2:
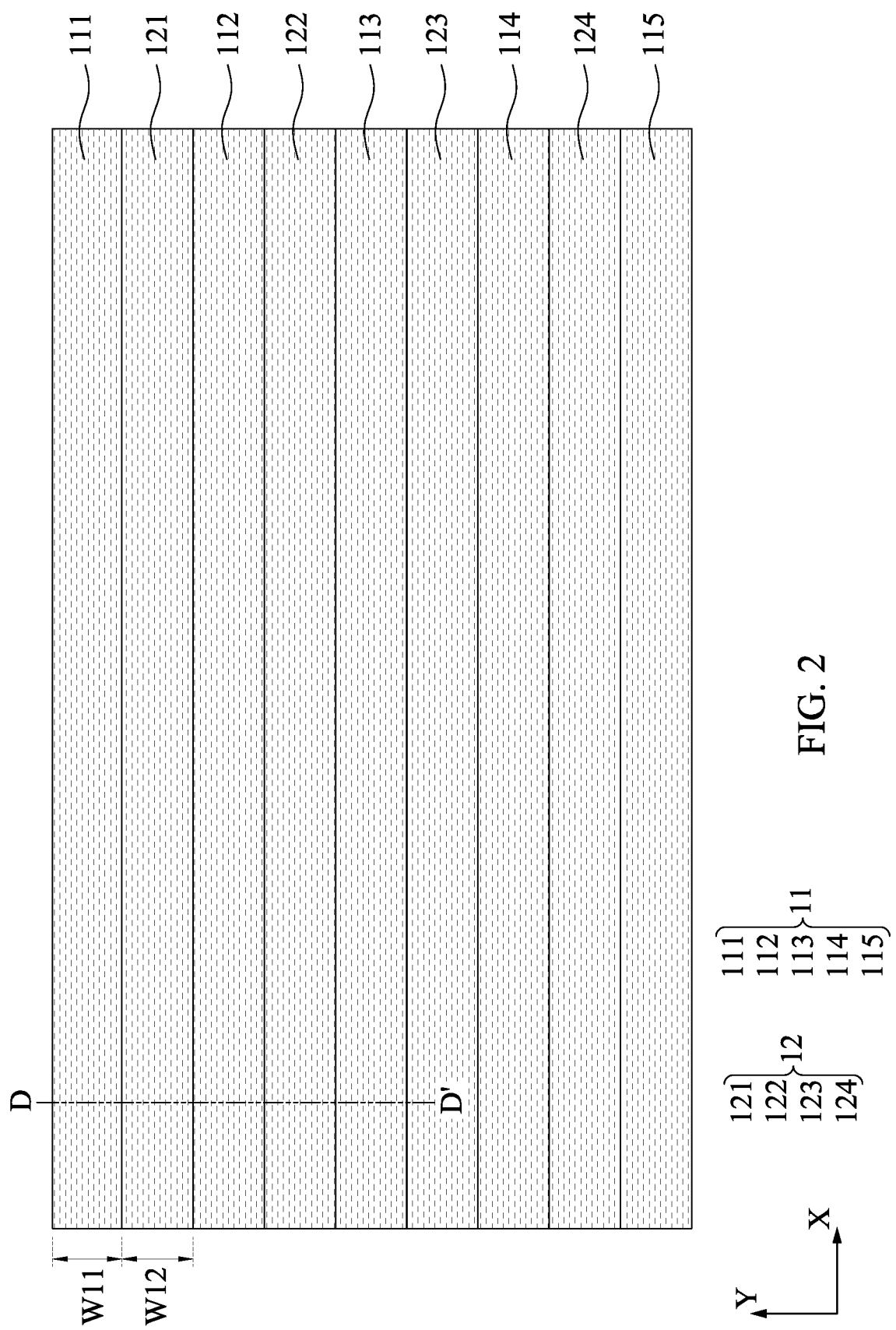
FIG. 2 is a schematic top-view diagram of the substrate after forming several recessed portions in accordance with some embodiments of the present disclosure.

Referring to FIG. 2, portions of the substrate 1 are removed, and a plurality of protruding portions 11 and a plurality of recessed portions 12 are thereby formed. The protruding portions 11 and the recessed portions 12 are alternately arranged along a first direction (e.g., Y direction). In some embodiments, each of the protruding portions 11 extends along a second direction (e.g., X direction) substantially orthogonal to the first direction. In some embodiments, each of the recessed portions 12 extends along the second direction. In some embodiments, the protruding portions 11 and the recessed portions 12 are substantially parallel. In some embodiments, each of the protruding portions 11 has a width W11 measured along the first direction substantially to a width W12 of each of the recessed portions 12 measured along the first direction.

In some embodiments, the plurality of protruding portions 11 include a first protruding portion 111, a second protruding portion 112, a third protruding portion 113, a fourth protruding portion 114 and a fifth protruding portion 115. The protruding portions 111 to 115 are serially arranged along the first direction. Adjacent protruding portions 11 are separated by a recessed portion 12. In some embodiments, the plurality of recessed portions 12 include a first recessed portion 121, a second recessed portion 122, a third recessed portion 123 and a fourth recessed portion 124. The recessed portions 121 to 124 are serially arranged along the first direction. It should be noted that a number of the protruding portions 11 and a number of the recessed portions 12 shown in the figures are for a purpose of illustration only and are not limited herein.

Figure 25:
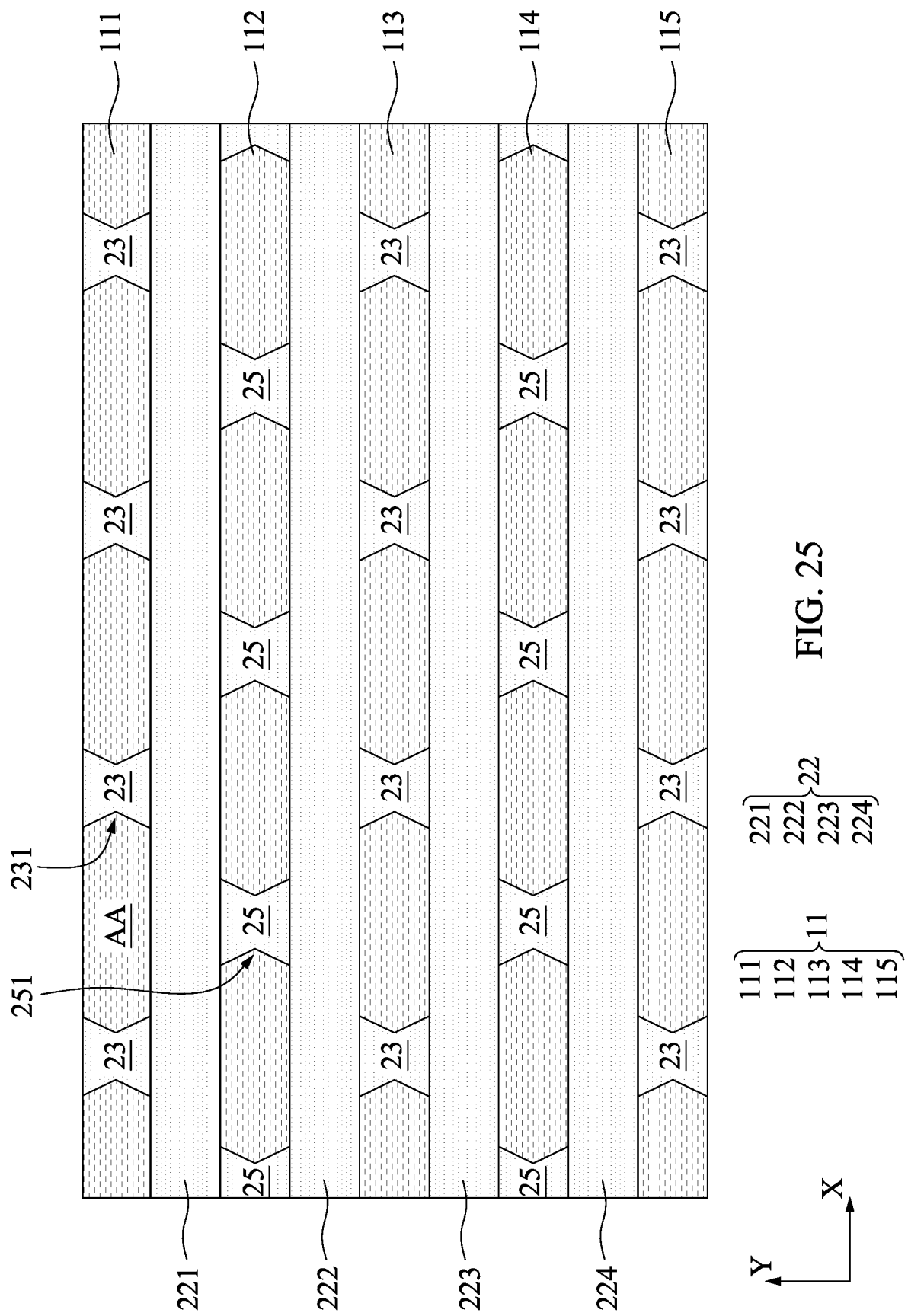
FIG. 25 is a schematic top-view diagram at a stage of a method shown in FIGS. 24A, 24B and 24C in accordance with some embodiments of the present disclosure.

It should be noted that a length L1 of the protruding portions 11 and a length L2 of the recessed portions 12 can be adjusted depending on a scale of a semiconductor structure. The method of the present disclosure includes forming active areas AA of an advanced generation of semiconductor structures, wherein the active areas AA are formed on the protruding portions 11, and the active areas AA have substantially equal sizes and are interlaced along the first direction (as shown in FIG. 25). Further detailed information is provided below.

Figure 3:
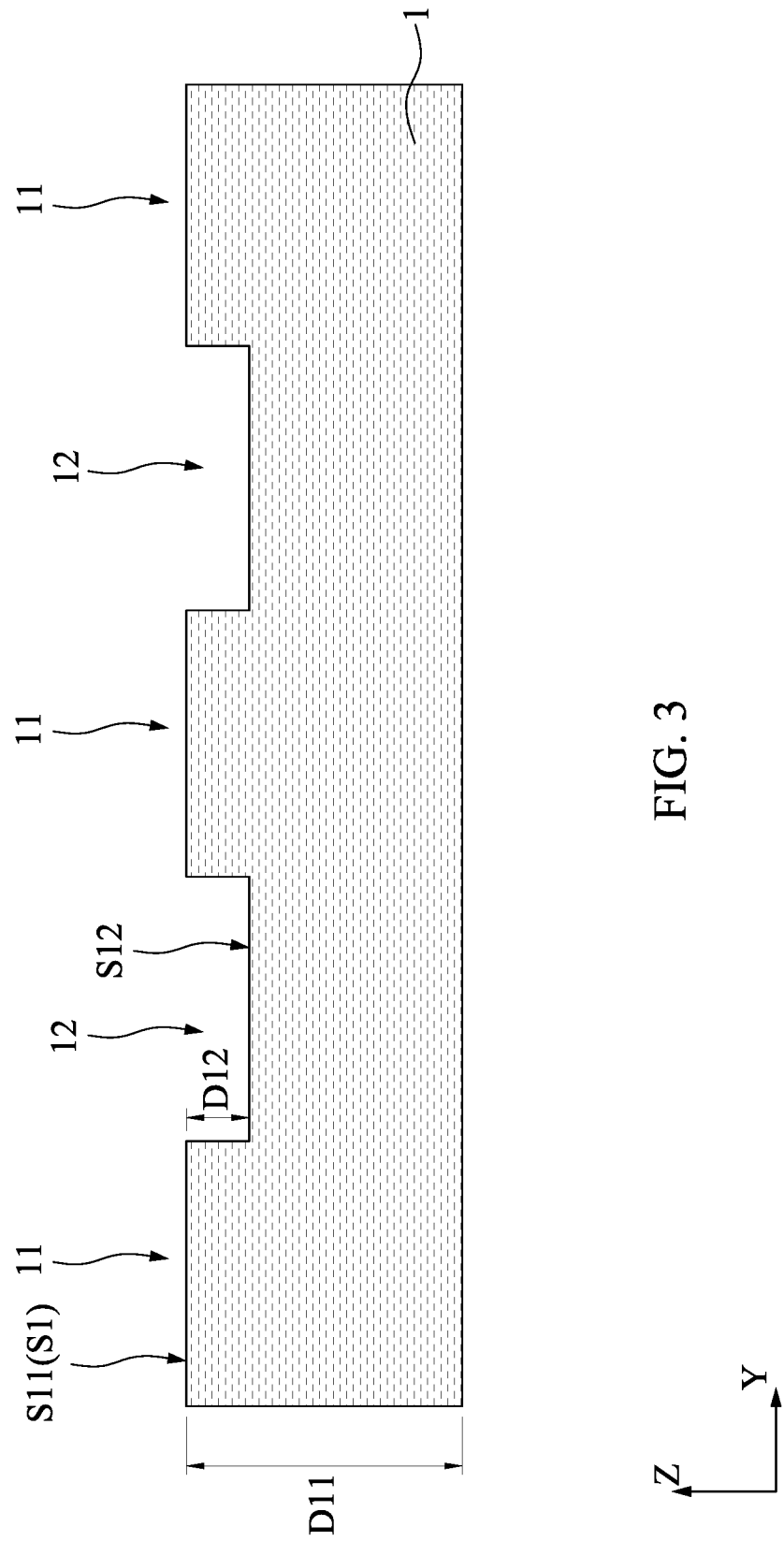
FIG. 3 is a schematic cross-sectional diagram along a line D-D' in FIG. 2 in accordance with some embodiments of the present disclosure.

Referring to FIG. 3, FIG. 3 is a cross-sectional diagram along a line D-D' in FIG. 2. In some embodiments, a top surface S11 of the protruding portion 11 defines a top surface S1 of the substrate 1. In some embodiments, a thickness D11 of the substrate 1 is about 775 microns (μm). In some embodiments, the recessed portion 12 is recessed from the top surface S1 of the substrate 1 by a distance D12 in a range of 0.1 to 1 μm. In other words, a top surface S12 of the recessed portion 12 is below the top surface S11 of the protruding portion 11 by the distance D12.

Figure 4:
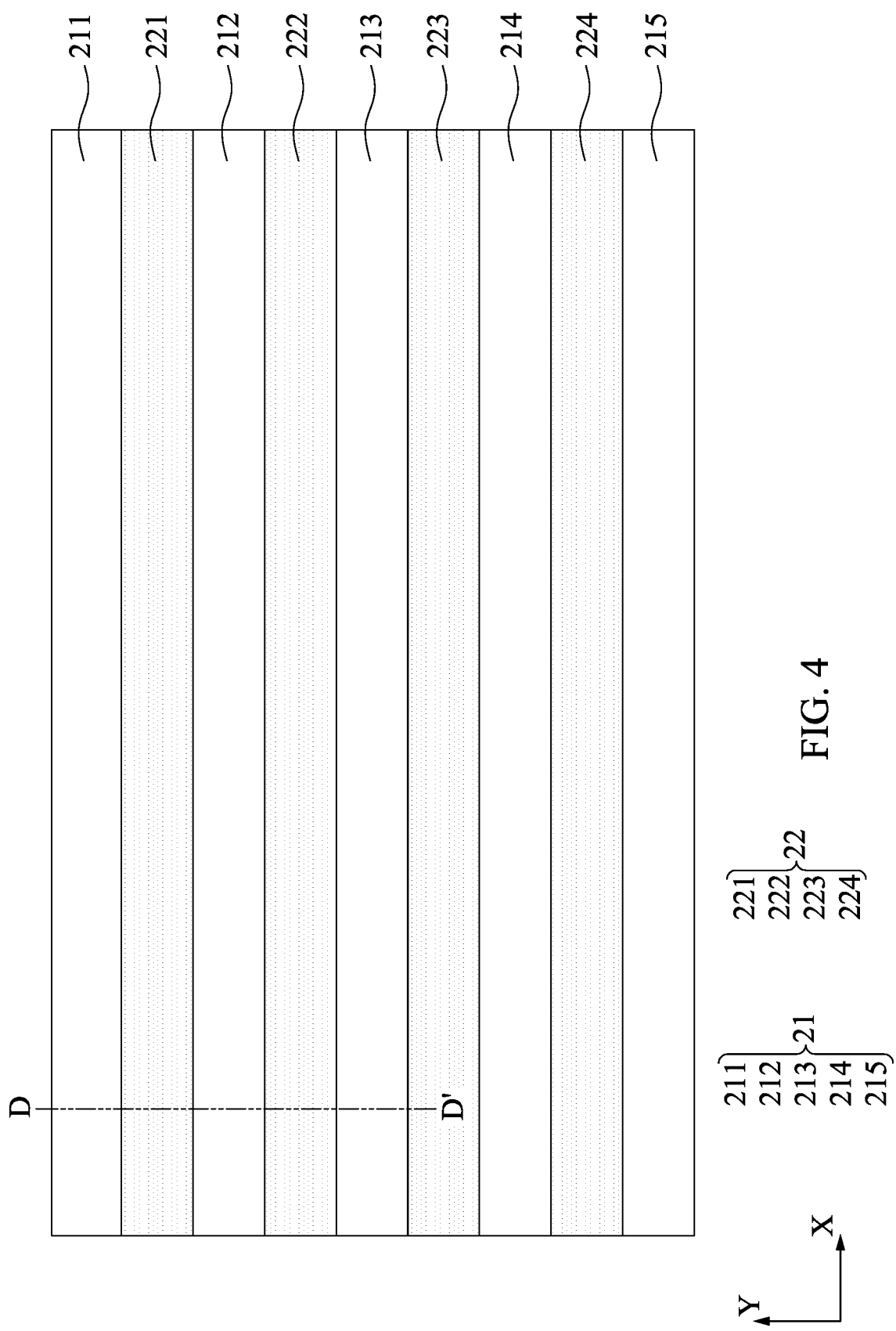
FIG. 4 is a schematic top-view diagram at stage after FIG. 2 in accordance with some embodiments of the present disclosure.

Referring to FIG. 4, a first dielectric layer 21 and a second dielectric layer 22 are formed over the substrate 1. The first dielectric layer 21 and the second dielectric layer 22 include different dielectric materials. In some embodiments, the first dielectric layer 21 and the second dielectric layer 22 have different etching rates when subjected to an etchant. In some embodiments, the first dielectric layer 21 includes nitride, and the second dielectric layer 22 includes oxide. In some embodiments, the first dielectric layer 21 covers the protruding portions 11 and the second dielectric layer 22 covers the recessed portions 12. In some embodiments, the first dielectric layer 21 includes multiple first segments (e.g., 211, 212, 213, 214 and 215) disposed over and corresponding to the protruding portions 111 to 115. In some embodiments, the second dielectric layer 22 includes multiple second segments (e.g., 221, 222, 223 and 224) disposed over and corresponding to the recessed portions 121 to 124. As shown in FIG. 4, each of the segments of the first dielectric layer 21 and each of the segments of the second dielectric layer 22 individually have a bar configuration extending along the second direction. In some embodiments, the multiple first segments and the multiple second segments are alternately arranged along the first direction.

In some embodiments, each of the first segments 211, 212, 213, 214 and 215 of the first dielectric layer 21 and each of the second segments 221, 222, 223 and 224 of the second dielectric layer 22 are substantially parallel along the second direction. For ease of illustration, the last digit of the numeral of a first segment shows a position in an order of the first segments along the first direction; and the last digit of the numeral of a second segment shows a position in an order of the second segments along the first direction. In other words, the first two digits of the numeral of a segment show which dielectric layer (21 or 22) the segment belongs to, and the last digit of the numeral of the segment shows its position in the order along the first direction.

For example, the first segment 211 is first among the multiple first segments 211 to 215 along the first direction; and the second segment 221 is first among the multiple second segments 221 to 224. The second segment 221 is disposed between the first segments 211 and 212 along the first direction, the first segment 212 is disposed between the second segments 221 and 222 along the first direction, and so forth.

Figure 5:
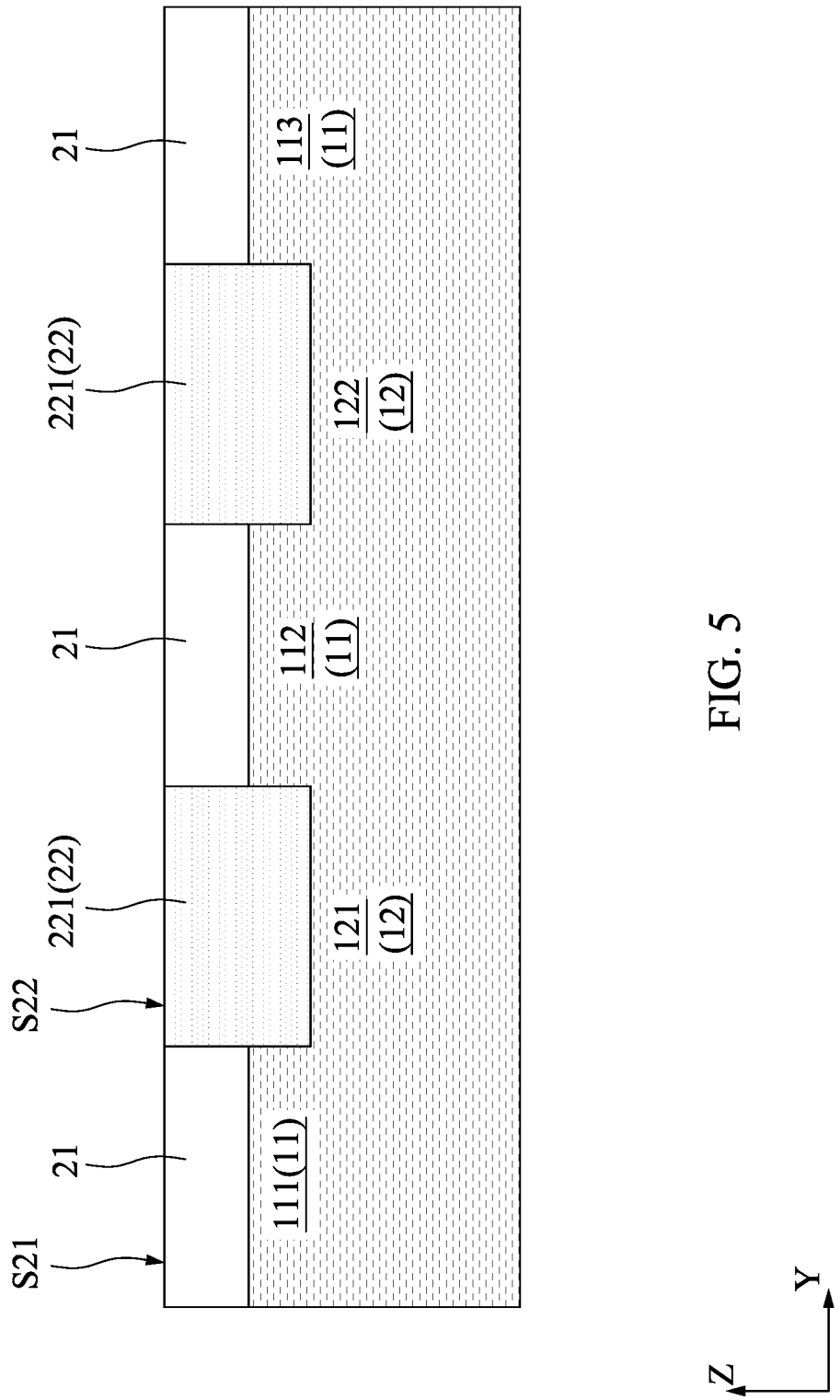
FIG. 5 is a schematic cross-sectional diagram along a line D-D' in FIG. 4 in accordance with some embodiments of the present disclosure.

Referring to FIG. 5, FIG. 5 is a cross-sectional diagram along the line D-D' in FIG. 4. As shown in FIG. 5, a top surface S21 of the first dielectric layer 21 may be substantially aligned with or coplanar with a top surface S22 of the second dielectric layer 22. Formation of the first and second dielectric layers 21 and 22 may include multiple operations.

In some embodiments, the first dielectric layer 21 is formed prior to the forming of the second dielectric layer 22. A deposition of the first dielectric layer 21 may be performed and followed by an etching operation to expose the recessed portions 12 of the substrate 1. A deposition of the second dielectric layer 22 may then be performed and followed by another etching operation to remove excess portions of the second dielectric layer 22 disposed over the first dielectric layer 21. In some embodiments, a planarization is performed to provide the coplanar top surfaces S21 and S22 of the first and second dielectric layers 21 and 22 as shown in FIG. 5.

In some embodiments, the second dielectric layer 22 is formed prior to the forming of the first dielectric layer 21. Operations can be similar to the operations as illustrated above, and repeated description is omitted herein.

Figure 6:
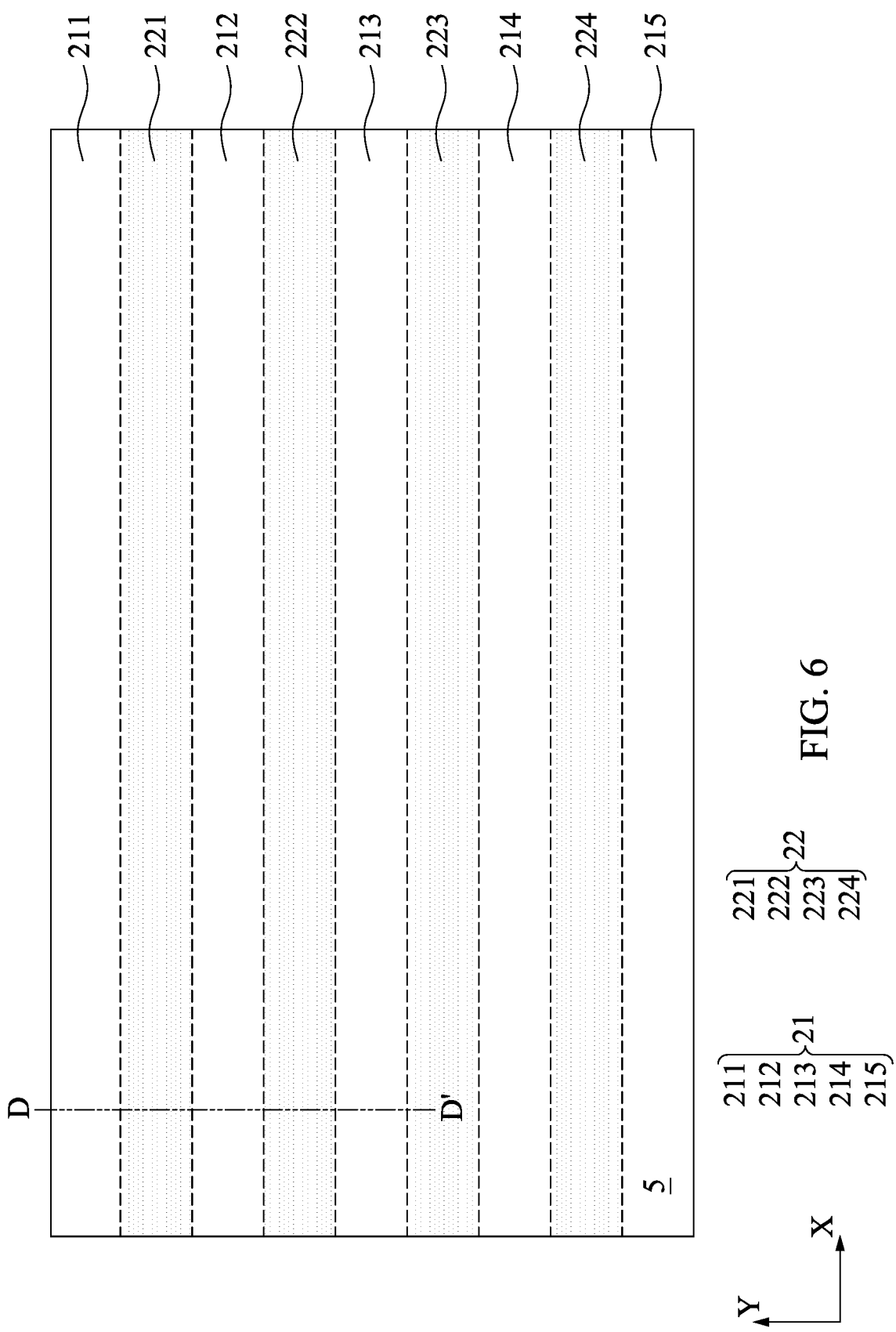
FIG. 6 is a schematic top-view diagram after FIG. 4 in accordance with some embodiments of the present disclosure.
Figure 7:
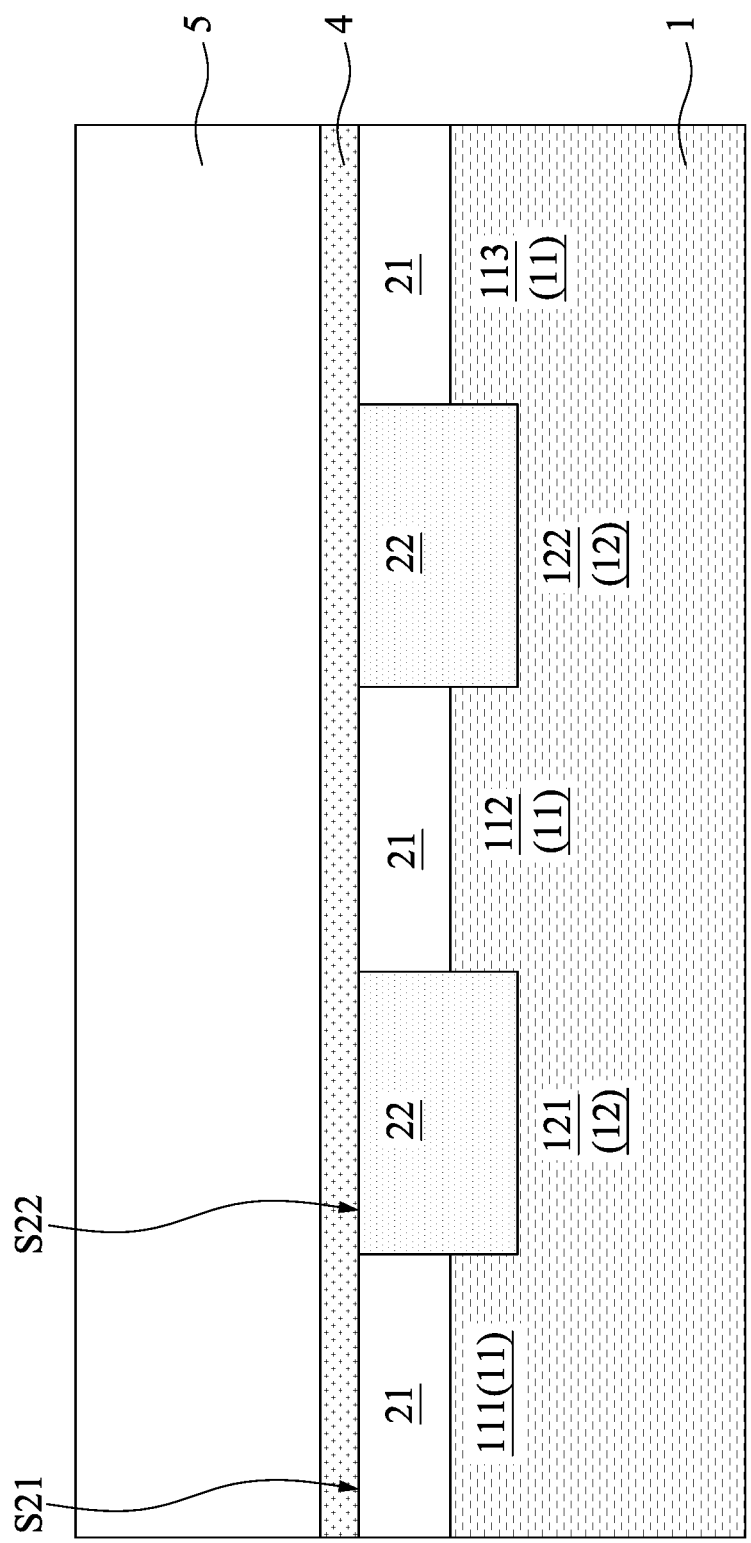
FIG. 7 is a schematic cross-sectional diagram along a line D-D' in FIG. 6 in accordance with some embodiments of the present disclosure.

Referring to FIG. 6, a first mask layer 4 and a photoresist layer 5 are sequentially formed over the first dielectric layer 21 and the second dielectric layer 22. The first mask layer 4 may be sensitive to light illumination. In some embodiments, the first mask layer 4 and the photoresist layer 5 together are referred to as a photosensitive layer or a photosensitive structure. In some embodiments, the first mask layer 4 is referred to as a lower sub-layer 4 and the photoresist layer 5 is referred to as an upper sub-layer of the photosensitive layer 5. In some embodiments, the first mask layer 4 and the photoresist layer 5 include different polymers. In some embodiments, a photosensitivity (or an optical sensitivity) of the photoresist layer 5 is different from a photosensitivity (or an optical sensitivity) of the first mask layer 4. In some embodiments, the first mask layer 4 is also referred to as a photosensitive layer. In some embodiments, the photoresist layer 5 includes a positive photoresist material. In some embodiments, the first mask layer includes a positive photosensitive material. In some embodiments, the first mask layer 4 contacts the first dielectric layer 21 and the second dielectric layer 22. In some embodiments, the first mask layer 4 is formed over a planar surface defined by the top surface S21 of the first dielectric layer 21 and the top surface S22 of the second dielectric layer 22.

Figure 8:
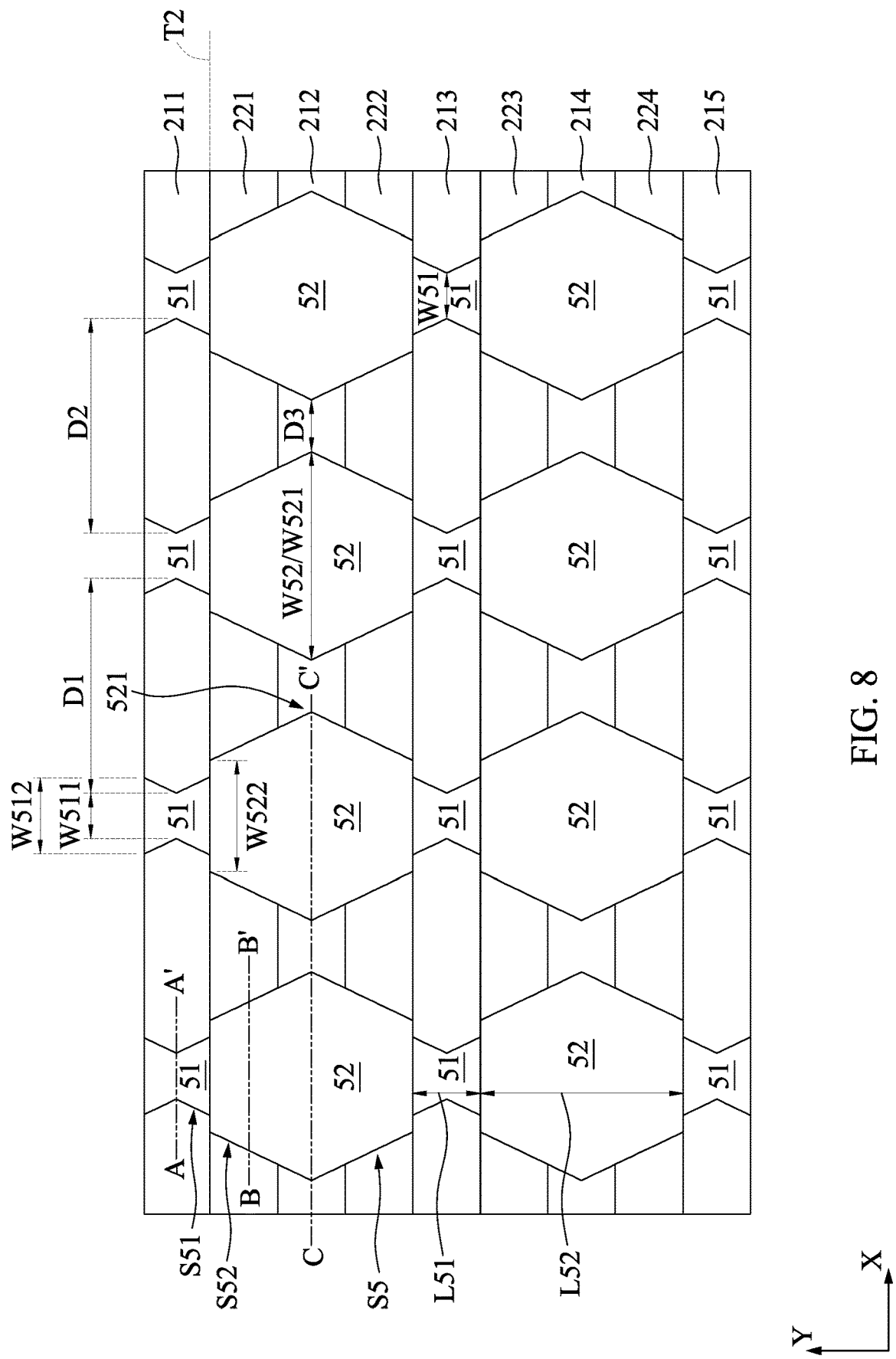
FIG. 8 is a schematic top-view diagram at stage after FIG. 7 in accordance with some embodiments of the present disclosure.

Referring to FIG. 8, a plurality of openings (e.g., 51 and 52) are formed in the photoresist layer 5 and in the first mask layer 4 (detailed illustration is provided in following paragraphs). The plurality of openings may include groups of openings having different depths and sizes.

From the top view as shown in FIG. 8, a plurality of first openings 51 are formed in the first dielectric layer 21, and a plurality of second openings 52 are formed in the first and second dielectric layers 21 and 22, wherein the second openings 52 are connected to the first openings along the first direction. In some embodiments, the first openings 51 are formed in odd-numbered first segments (i.e., 211, 213 and 215). In some embodiments, the first openings 51 are formed over odd-numbered protruding portions (i.e., 111, 113 and 115 shown in FIG. 2). In some embodiments, distances (e.g., D1 and D2) between adjacent first openings 51 along the second direction are substantially equal. In other words, an interval distance (D1 or D2) between first openings 51 in a first segment 211, 212, 213, 214 or 215 are substantially consistent along the second direction.

The plurality of second openings 52 are disposed between the first openings 51 along the first direction. In some embodiments, the second openings 52 are formed in even-numbered first segments (i.e., 212 and 214). In some embodiments, the second openings 52 are formed over even-numbered protruding portions (i.e., 112 and 114 shown in FIG. 2). In some embodiments, the second openings 52 are formed in the second dielectric layer 22. In some embodiments, the second openings 52 are formed over the recessed portions 22 shown in FIG. 2. In some embodiments, each second opening 52 connects adjacent first openings 51 along the first direction. In some embodiments, a distance D3 between two adjacent second openings 52 in a first segment 212 or 214 is substantially consistent along the second direction.

A dimension or a size of the second opening 52 may be greater than a dimension or a size of the first opening 51. In some embodiments, a width W51 of the first opening 51 is substantially less than a width W52 of the second opening 52, wherein the widths W51 and W52 are measured along the second direction. In some embodiments, a length L51 of the first opening 51 is substantially less than a length L52 of the second opening 52, wherein the lengths L51 and L52 are measured along the first direction. In some embodiments, the length L52 of the second opening 52 is about 3 times the length L51 of the first opening 51.

In some embodiments, the first openings 51 are for a purpose of definition of isolations (e.g., 23 in FIG. 25) on the odd-numbered first protruding portions 111, 113 and 115, and the second openings 52 are for a purpose of definition of active areas on the even-numbered first protruding portions 112 and 114 (e.g., AA in FIG. 25). In order to define the active areas AA with substantially equal sizes and interlaced along the first direction on different protruding portions 11 as shown in FIG. 25, the width W52 of the second opening 52 should be substantially equal to the distance D1 or D2 of adjacent first openings 51. In addition, a distance D3 between adjacent second openings 52 along the second direction should be substantially equal to the width W51 of the first opening 51.

Configurations of the first openings 51 and the second openings 52 from a top view are not limited herein as long as the above-described criteria are met. For example, a configuration of the first openings 51 can be rectangular as shown in FIG. 26, which is a top view of a stage of the method showing the openings 51 and 52 in accordance with some embodiments of the present disclosure.

Figure 26:
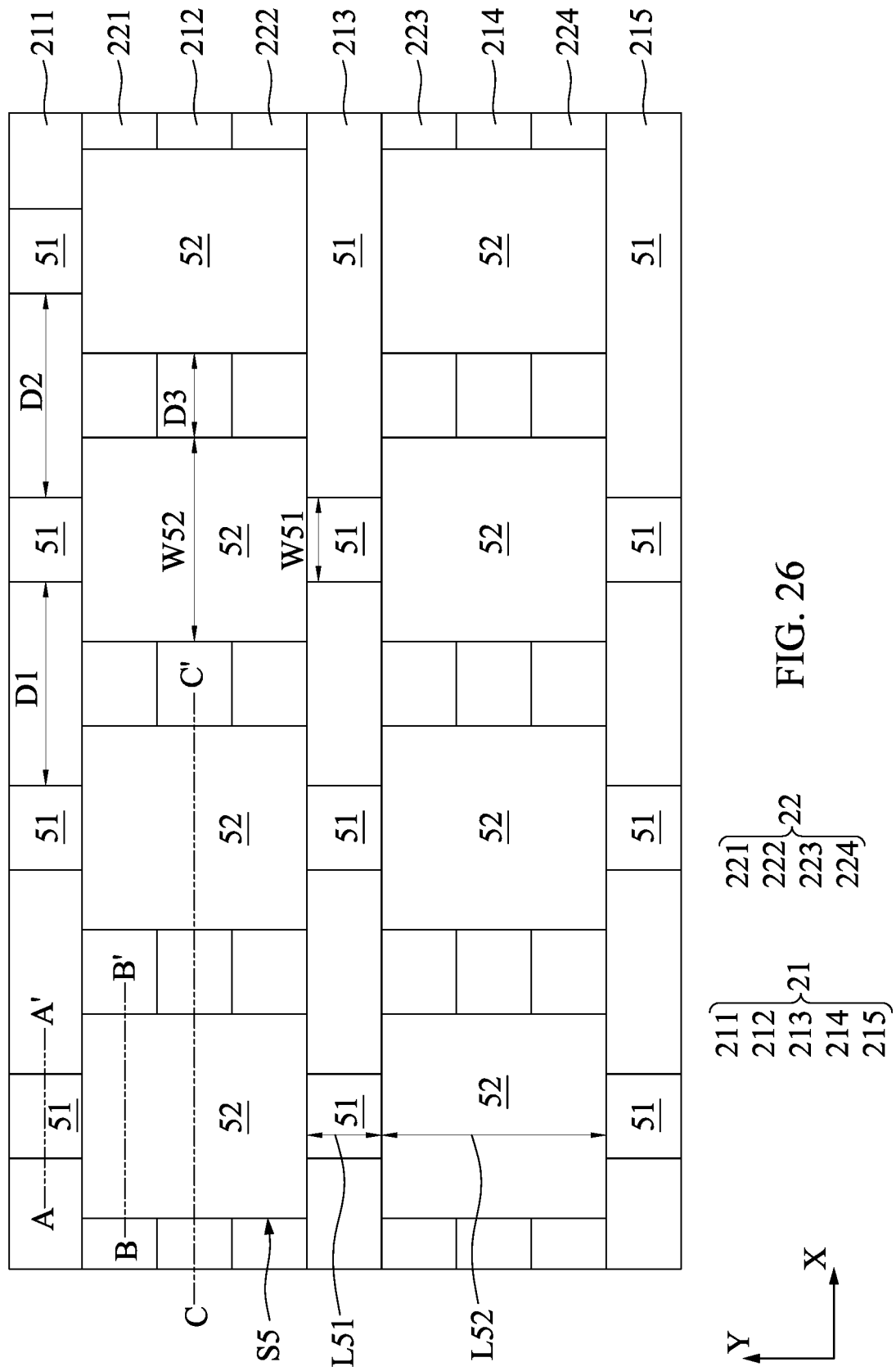
FIGS. 26 and 27 are schematic top-view diagrams of a patterned photosensitive layer at a stage of the method in accordance with different embodiments of the present disclosure.

Referring back to FIG. 8, in alternative embodiments, each of the first openings 51 can have a dumbbell-like configuration for a purpose of increasing area of an active area at a concave portion 511 of the first opening 51, in contrast to the embodiments shown in FIG. 26. In some embodiments, the concave portion 511 of the first opening 51 is disposed at or near a central axis of the first segment 211, 213 or 215, wherein the central axis of the first segment 211, 213 or 215 extends along the second direction.

In some embodiments, each of the second openings 52 can have a regular hexagonal configuration as shown in FIG. 8. In some embodiments, the width W51 of the first opening 51 is measured at the concave portion 511 along the second direction. In some embodiments, the width W52 of the second opening 52 is measured at a convex portion 521 of the second opening 52 along the second direction. In some embodiments, the convex portion 521 of the second opening 52 is disposed at or near a central axis of the first segment 212 or 214, wherein the central axis of the first segment 212 or 214 extends along the second direction.

Sidewalls of the first openings 51 and the second openings 52 together define a wavy sidewall S5 extending along the first direction. In some embodiments, a width of the first opening 51 varies along the first direction, and the width W511 or W51 is a minimal width of the first opening 51. In some embodiments, a width of the second opening 52 varies along the first direction, and the width W521 or W52 is a maximal width of the second opening 52. In some embodiments, a width W512 of the first opening 51 at an interface T2 of the first dielectric layer 21 and the second dielectric layer 22 is substantially less than a width W522 of the second opening 52 at the interface T2. In other words, a step configuration is defined at a connection between a sidewall S51 of the first opening 51 and a sidewall S52 of the second opening 52. However, the present disclosure is not limited thereto.

Figure 27:
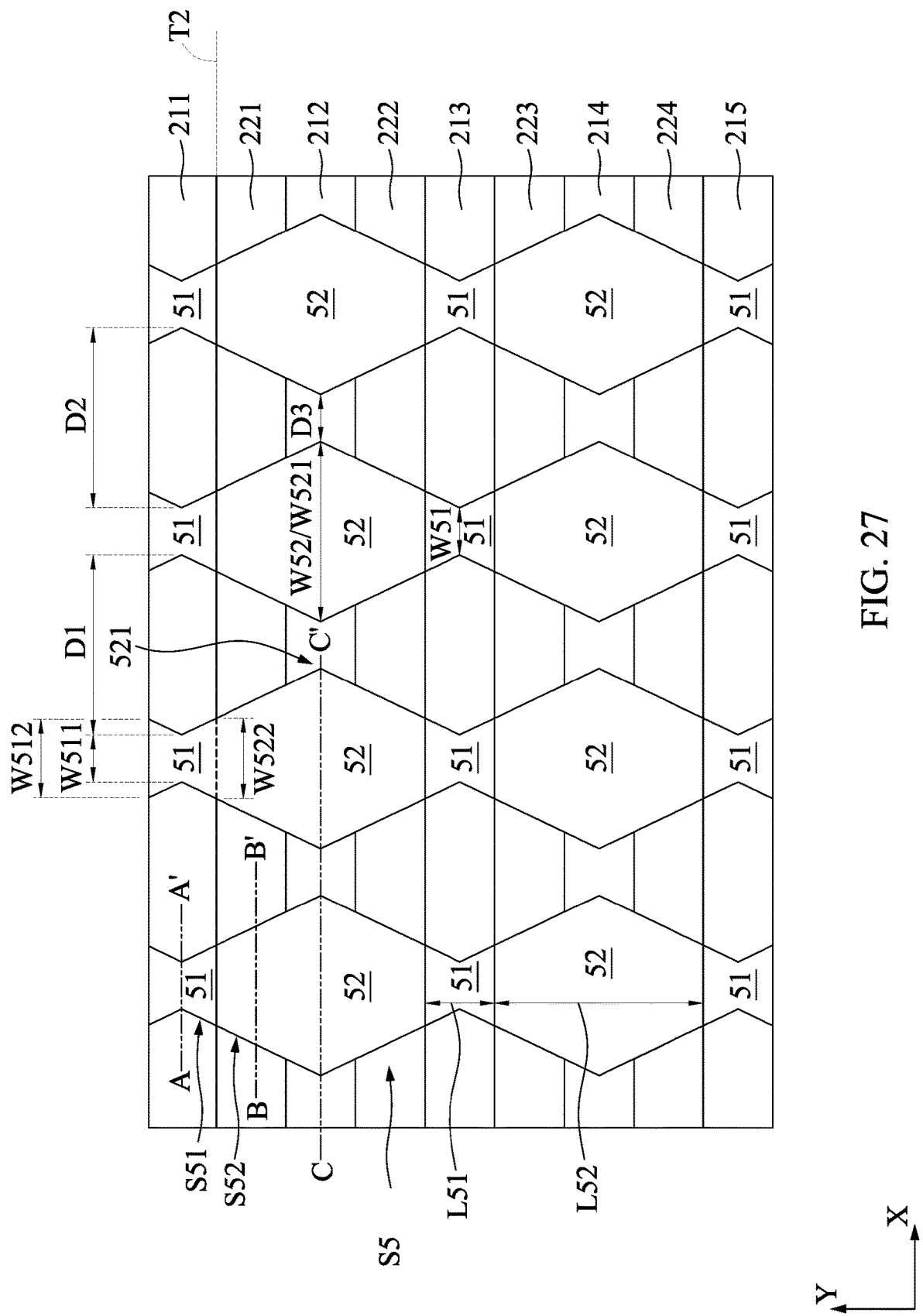

In other embodiments as shown in FIG. 27, each of the second openings 52 can have a hexagonal configuration but with different lengths of sides. In some embodiments, the width W512 of the first opening 51 at the interface T2 of the first dielectric layer 21 and the second dielectric layer 22 is substantially less than the width W522 of the second opening 52 at the interface T2. In some embodiments, the sidewall S51 of the first opening 51 and the sidewall S52 of the second opening 52 are smoothly connected. In some embodiments, the sidewall S51 of the first opening 51 and the sidewall S52 of the second opening 52 together define a planar sidewall. In some embodiments, the first and second openings 51 and 52 together have a configuration similar to end-to-end rhombuses.

For a purpose of illustration, cross-sectional views at different stages of the method are provided in the figures in accordance with some embodiments of the present disclosure. Figures ending with a letter A (e.g., FIG. 9A, FIG. 10A, etc.) indicate cross-sectional views along a line A-A' in FIG. 8 at different stages of the method; figures ending with a letter B (e.g., FIG. 9B, FIG. 10B, etc.) indicate cross-sectional views along a line B-B' in FIG. 8 at different stages of the method; and figures ending with a letter C (e.g., FIG. 9C, FIG. 10C, etc.) indicate cross-sectional views along a line C-C' in FIG. 8 at different stages of the method.

Figures 9A, 9B:
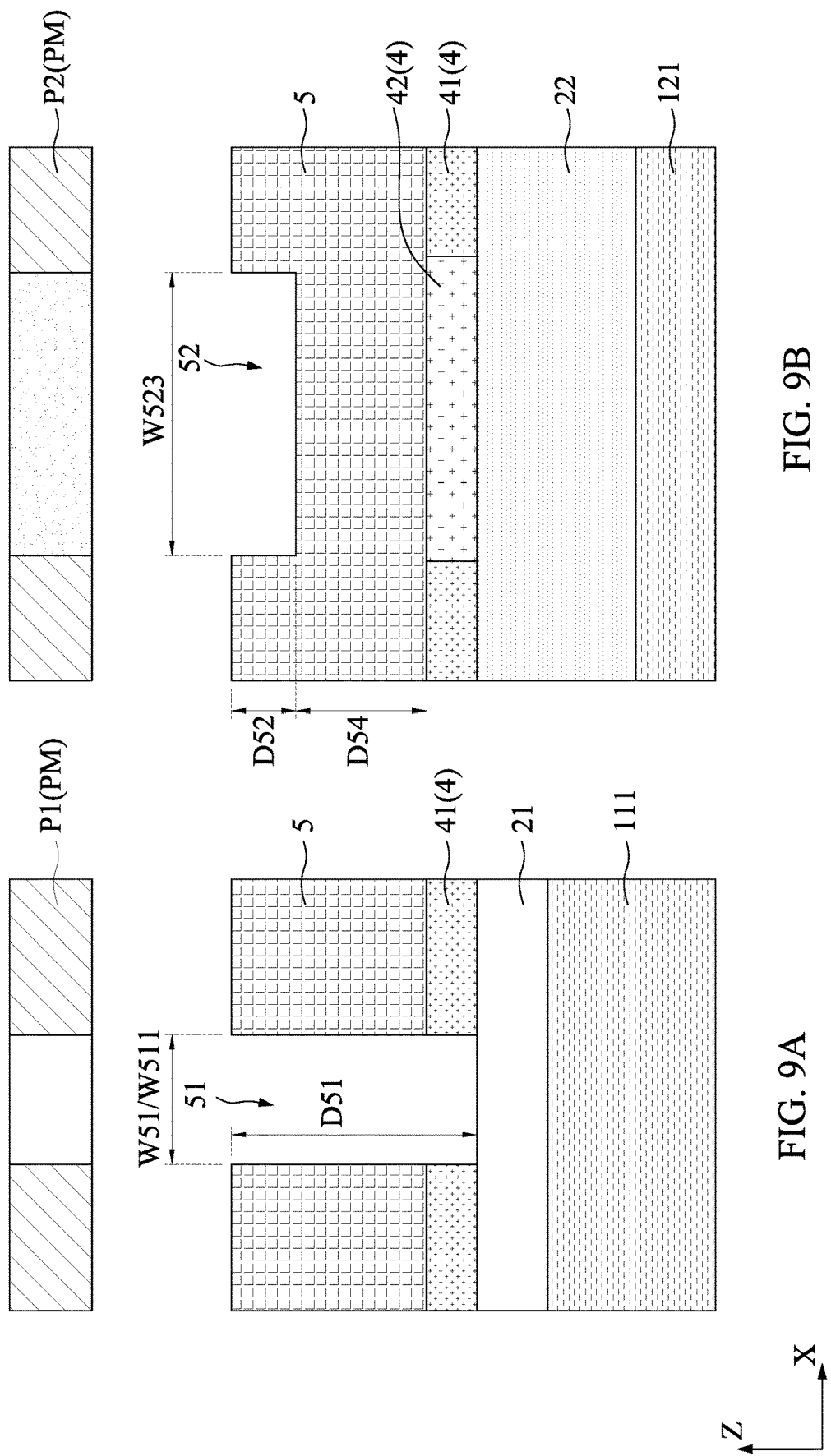
Figure 9C:
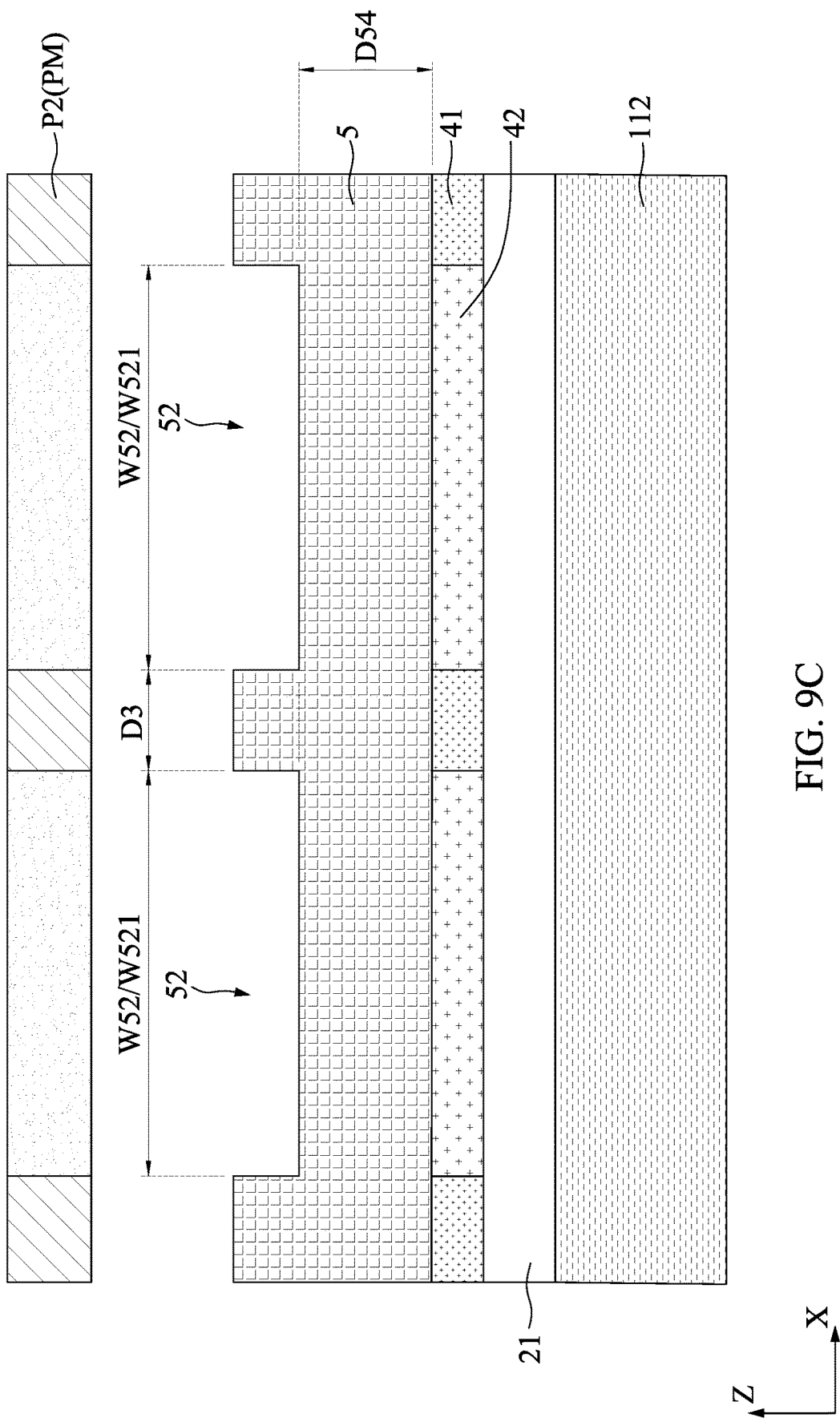
FIGS. 9C, 10C, 11C, 12C, 13C, 14C, 15C, 16C, 17C, 19C, 20C, 21C, 22C and 24C are schematic cross-sectional diagrams along a line C-C' in FIG. 8 at different stages of the method in accordance with some embodiments of the present disclosure.

Referring to FIGS. 9A, 9B and 9C, cross-sectional views along the lines A-A', B-B', and C-C' are provided. In some embodiments, the openings 51 and 52 are defined by a photomask PM. In some embodiments, the openings 51 and 52 are formed concurrently by a same patterning operation. In some embodiments, EBL is applied in the patterning operation.

The photomask PM may include different patterns to define the first openings 51 and the second openings 52. In some embodiments, a first pattern P1 of the photomask PM is for defining the first openings 51, and a second pattern P2 of the photomask PM is for defining the second openings 52. The first pattern P1 and the second pattern P2 may include different optical transmission rates. In some embodiments, the first pattern P1 has an optical transmission rate substantially greater than an optical transmission rate of the second pattern P2. In some embodiments, the optical transmission rate of the second pattern P2 is $\frac{1}{10}$ to $\frac{9}{10}$ of the optical transmission rate of the first pattern P1. In some embodiments, the optical transmission rate of the first pattern P1 is 100%. In some embodiments, the optical transmission rate of the second pattern P2 is ⅓.

The formation of the first openings 51 and the second openings 52 can include multiple operations. In some embodiments, an exposure operation for the photoresist layer 5 is performed using the photomask PM. In some embodiments, a developer is applied to the photoresist layer 5 to form the first openings 51 and the second openings 52. The first openings 51 having a depth D51 and the second openings 52 having a depth D52 are thereby formed, wherein the depth D51 is substantially greater than the depth D52 due to different optical transmission rates of the patterns P1 and P2 of the photomask PM. In some embodiments, the depth D51 of the first openings 51 is substantially equal to a total thickness of the photoresist layer 5 and the first mask layer 4. In some embodiments, the depth D52 of the second openings 52 is about ⅒ to ⁹⁄₁₀ of the depth D51 according to the optical transmission rate of the pattern P2. In some embodiments, a thickness D54 of a portion of the photoresist layer 5 remaining under the second openings 52 is greater than zero.

In some embodiments, the first opening 51 penetrates the photoresist layer 5 and the first mask layer 4 due to a high optical transmission rate of the first pattern P1. In some embodiments, the developer removes a portion of the first mask layer 4 overlapped by the first opening 51. In some embodiments, the second opening 52 partially penetrates the photoresist layer 5 due to a low optical transmission rate. In some embodiments, a chemical property of a portion of the first mask layer 4 overlapped by the second opening 52 is changed due to the optical illumination of the exposure operation during the patterning operation. In some embodiments, the portion of the first mask layer 4 overlapped by the second opening 52 is degraded by the exposure operation, while the photoresist layer 5 is only partially degraded due to a difference in the photosensitivities of the first mask layer 4 and the photoresist layer 5. For ease of description, the degraded portion of the first mask layer 4 is referred to as a second mask layer 42, and the remaining portion of the first mask layer 4 free of degradation is referred to as the first mask layer 41. In some embodiments, a width W523 of the second opening 52 shown in FIG. 9B is substantially less than or equal to the width W521 shown in FIG. 9C depending on different applications.

Figure 10B:
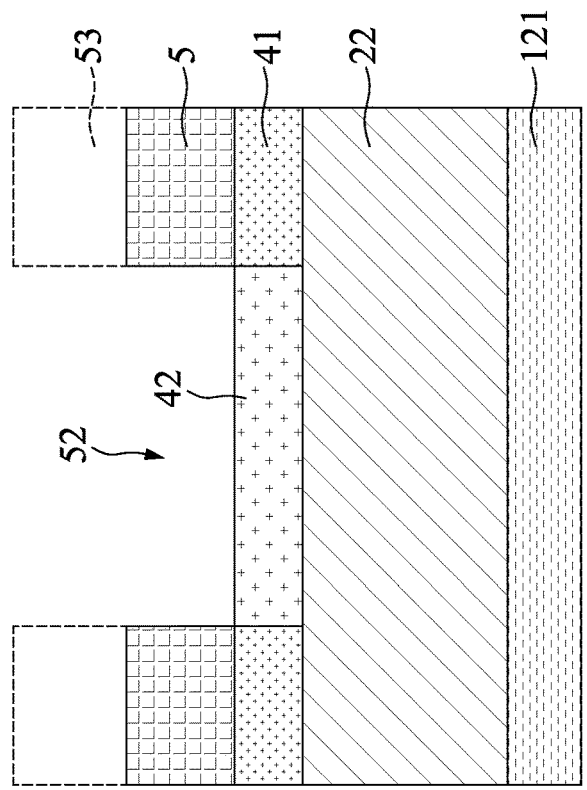
Figure 10A:
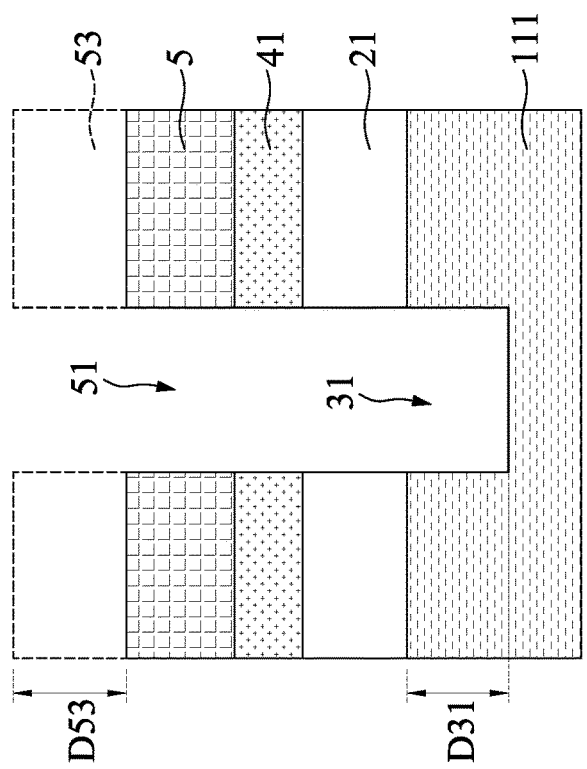
Figure 10C:
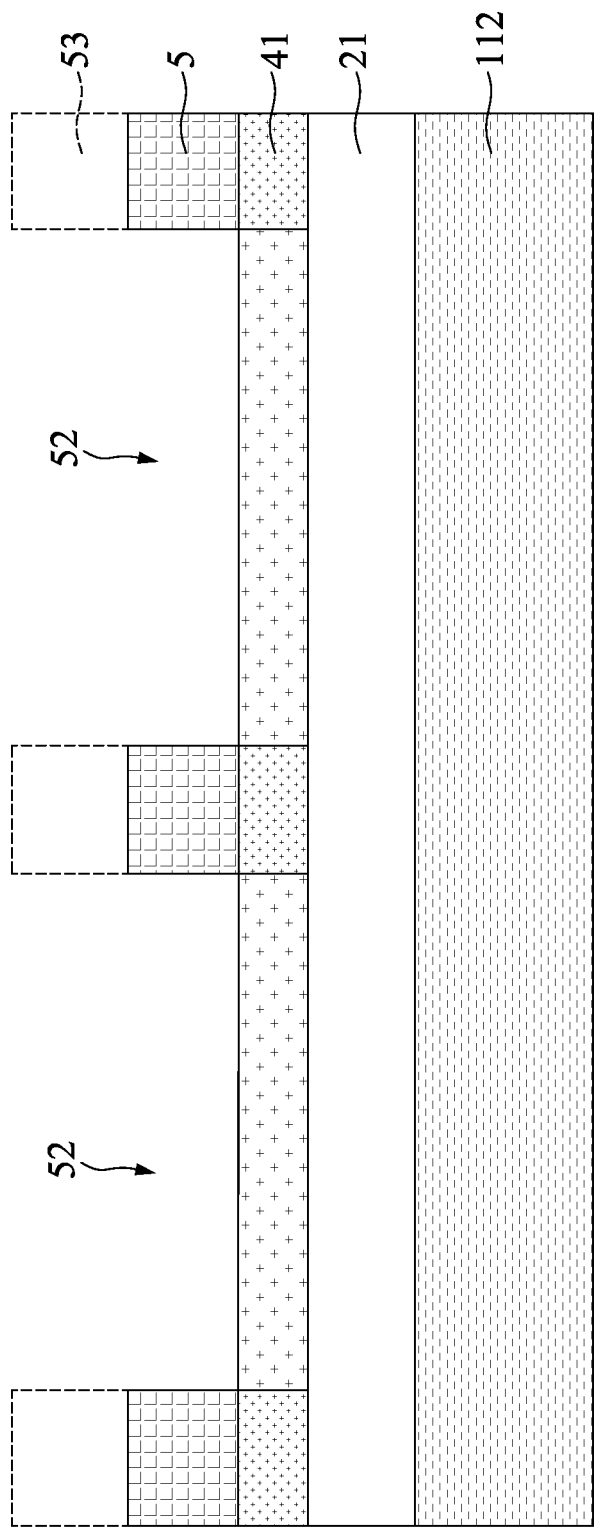

Referring to FIGS. 10A, 10B and 10C, a first recess 31 of the protruding portion 11 is formed under the first opening 51 using the photoresist layer 5 as a mask. In some embodiments, a portion of the first dielectric layer 21 exposed by the first opening 51 is removed using the photoresist layer 5 as a mask. In some embodiments, a portion of the protruding portion 11 of the substrate 1 under the first opening 51 is partially removed. The removal of the portion of the first dielectric layer 21 and the removal of the portion of the protruding portion 11 can be performed by a same etching operation or by different etching operations, and it are not limited herein. In some embodiments, the etching operation includes a dry etching operation.

In some embodiments, an etchant of the etching operation has a low selectivity to the second mask layer 42. In some embodiments, the etching operation stops at the second mask layer 42. Therefore, the portion of the second dielectric layer 22 under the second opening 52 and the portion of the first dielectric layer 21 under the second opening 52 are left remaining. In some embodiments, a depth D31 of the first recess 31 is in a range of 0.1 to 1 μm. In some embodiments, the depth D31 is substantially equal to the depth D12 as shown in FIG. 3. In some embodiments, a portion 53 of the photoresist layer 5 is removed by the etching operation. In some embodiments, the portion 53 has a thickness D53 substantially equal to the thickness D54 as shown in FIGS. 9B and 9C.

Figure 11A:
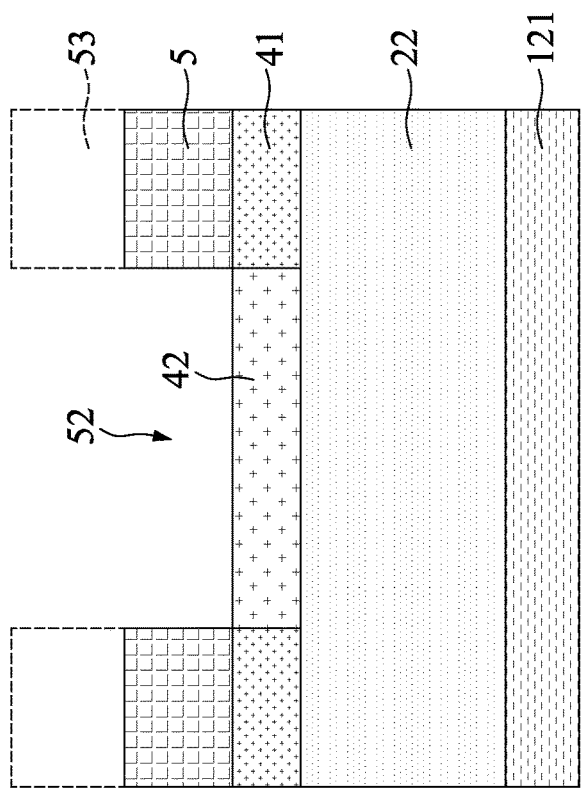
Figure 11B:
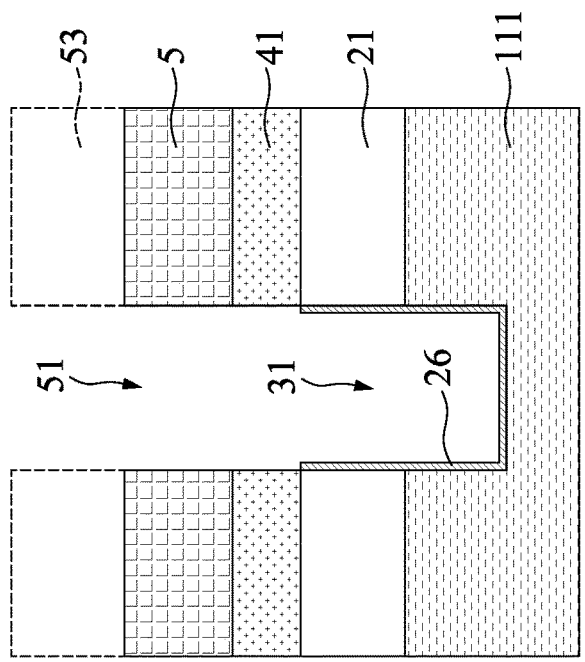
Figure 11C:
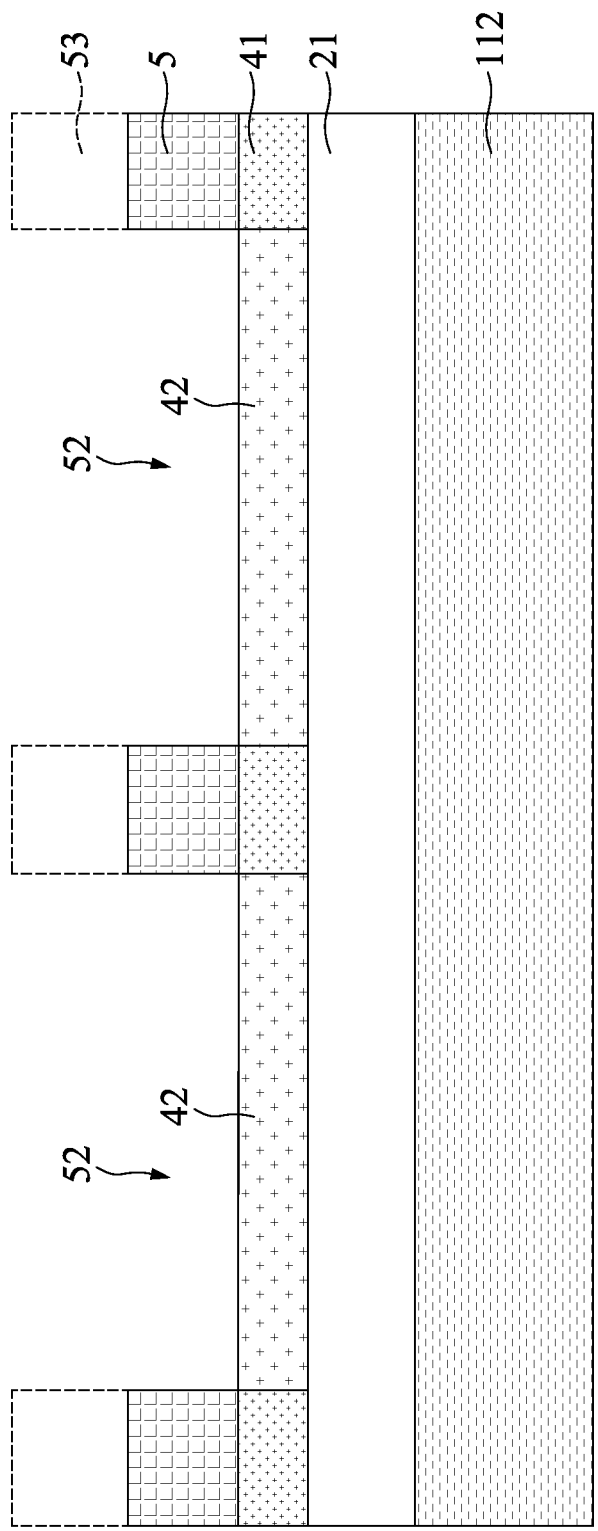

Referring to FIGS. 11A, 11B and 11C, a first conformal layer 26 is formed lining the first recess 31 and the first dielectric layer 21. In some embodiments, the first conformal layer 26 is formed by an oxidation of materials of the first dielectric layer 21 and the substrate 1. In some embodiments, the first conformal layer 26 includes oxide. In some embodiments, a portion of the first conformal layer 26 contacting the substrate 1 includes silicon oxide, and a portion of the first conformal layer 26 contacting the first dielectric layer 21 includes oxynitride.

Figure 12A:
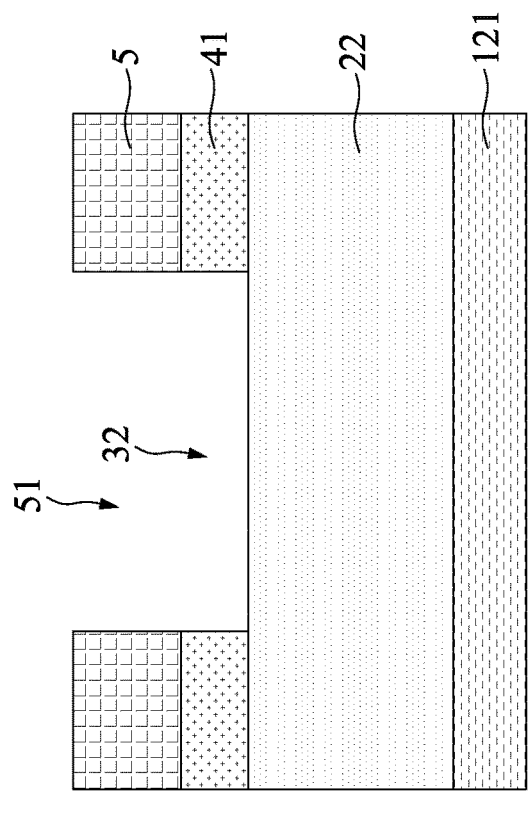
Figure 12B:
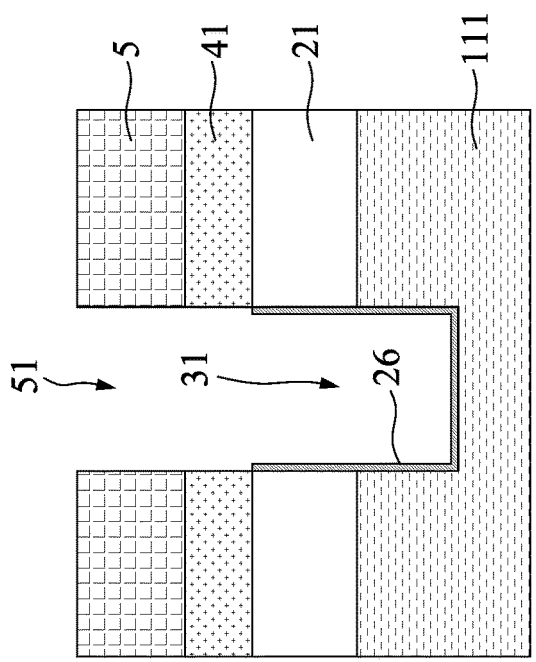
Figure 12C:
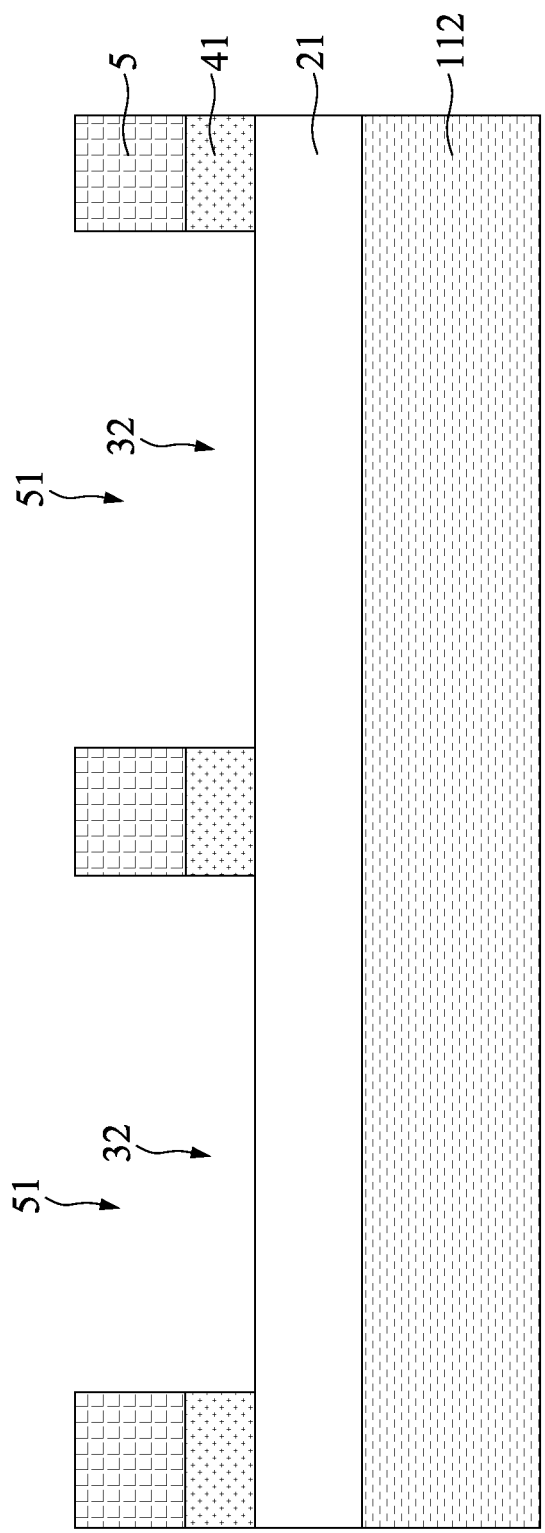

Referring to FIGS. 12A, 12B and 12C, a portion of the second mask layer 42 exposed by the second opening 52 is removed, and third openings 32 are thereby formed. In some embodiments, the second mask layer 42 is removed by a developer. In some embodiments, a sidewall of the first mask layer 41 is aligned with or coplanar with a sidewall of the photoresist layer 5. In some embodiments, the third openings 32 are connected to the second openings 52 respectively. In some embodiments, the third openings 32 are through holes of the first mask layer 41. In some embodiments, the second dielectric layer 22 is partially exposed by the third openings 32 as shown in FIG. 12B. In some embodiments, the first dielectric layer 21 is partially exposed by the third openings 32 as shown in FIG. 12C.

Figure 13B:
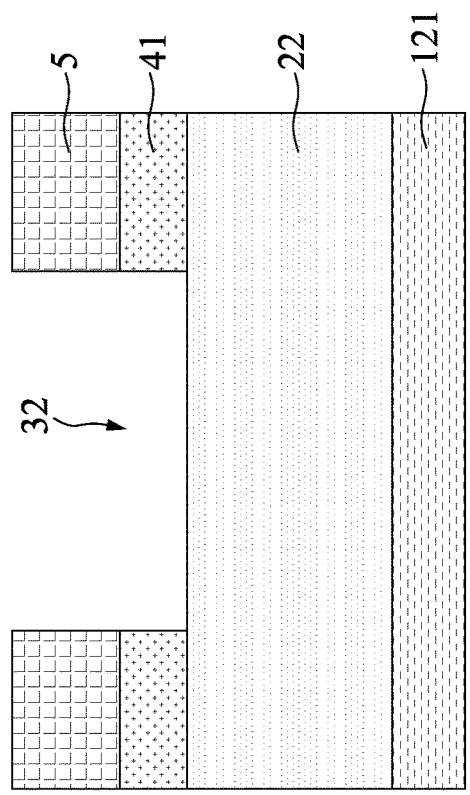
Figure 13A:
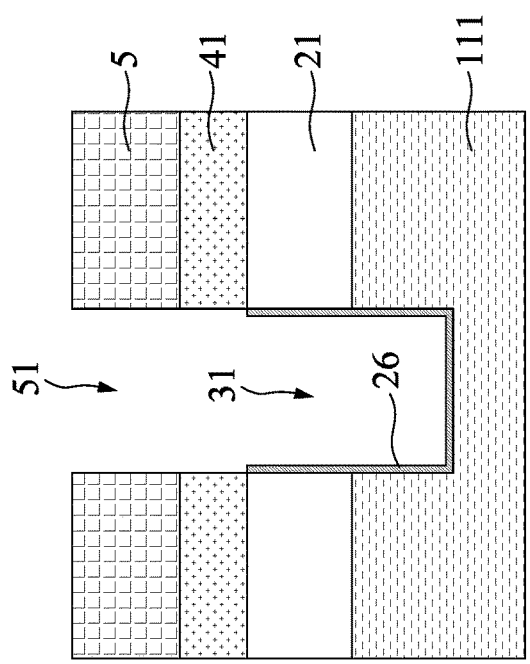
Figure 13C:
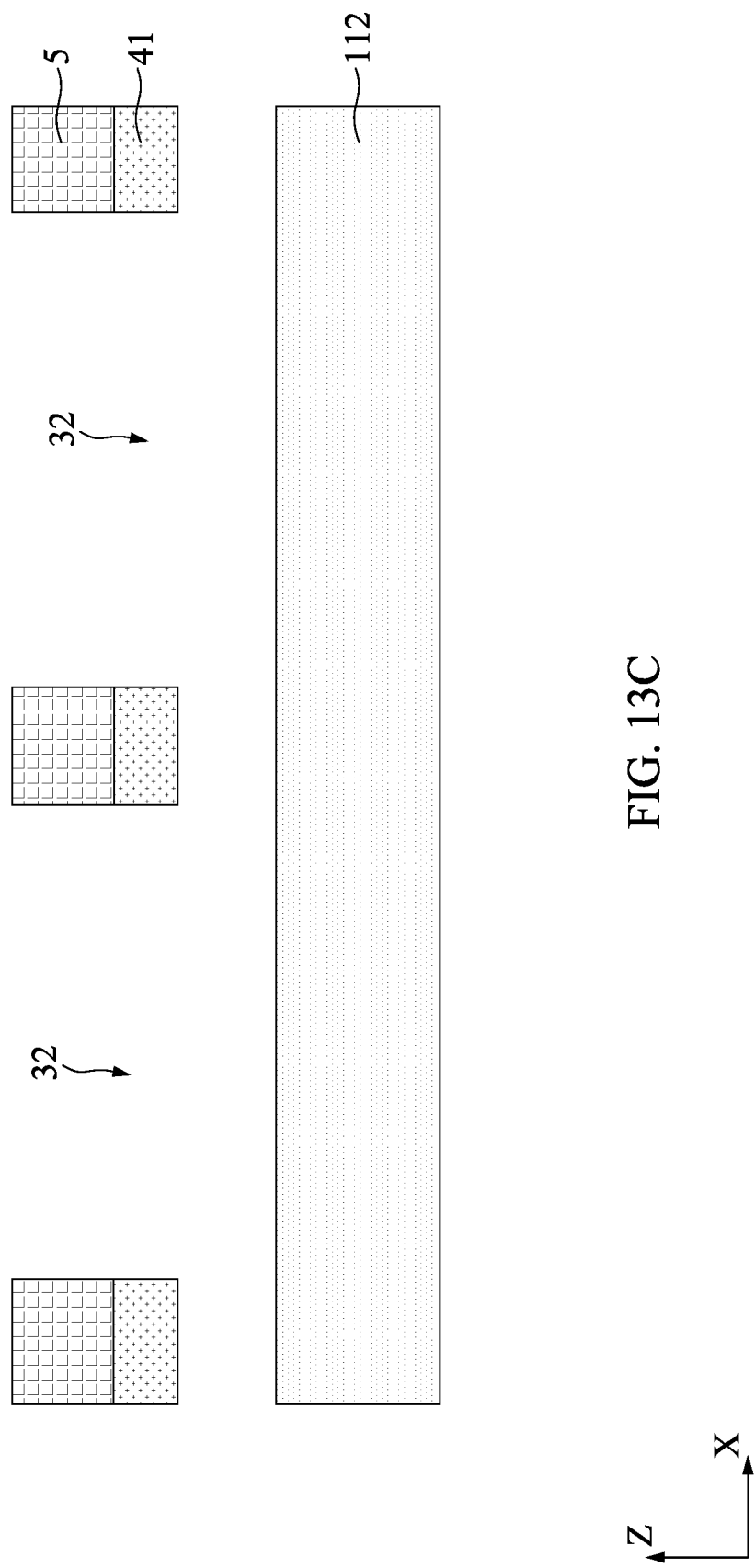

Referring to FIGS. 13A, 13B and 13C, the first dielectric layer 21 is partially removed. In some embodiments, a wet etching operation is performed, and exposed portions of the first dielectric layer 21 are removed. In some embodiments, an etchant of the wet etching operation includes a high etch rate selectivity of a material of the first dielectric layer 21 to a material of the first conformal layer 26. In some embodiments, even-numbered first segments (e.g., 212 and 214) of the first dielectric layer 21 are removed due to exposure to the etchant through the third openings 32. In some embodiments, even-numbered protruding portions 112 and 114 (as shown in FIG. 2) are exposed to air in a processing chamber after the partial removal of the first dielectric layer 21. In some embodiments, odd-numbered first segments (e.g., 211, 213 and 215) of the first dielectric layer 21 are left remaining due to protection from the etchant by the first conformal layer 26. In some embodiments, the second dielectric layer 22 is also left remaining due to a high etch rate selectivity of the material of the first dielectric layer 21 to a material of the second dielectric layer 22.

Figure 14A:
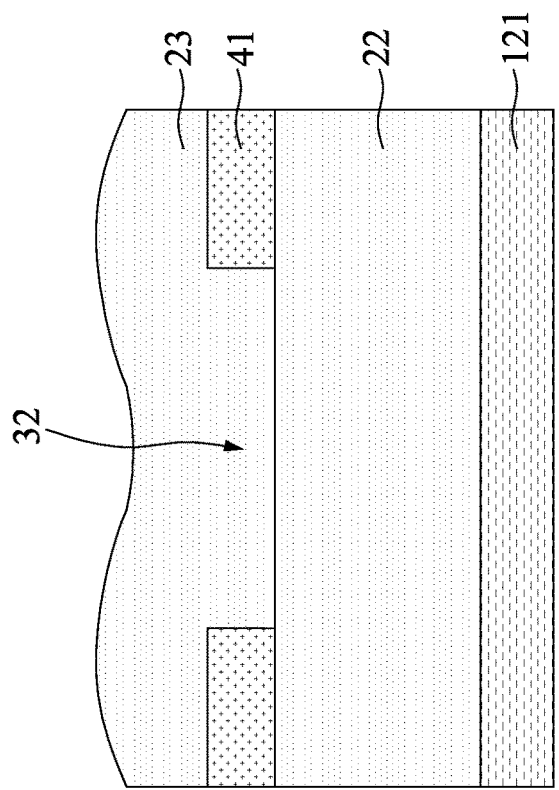
Figure 14B:
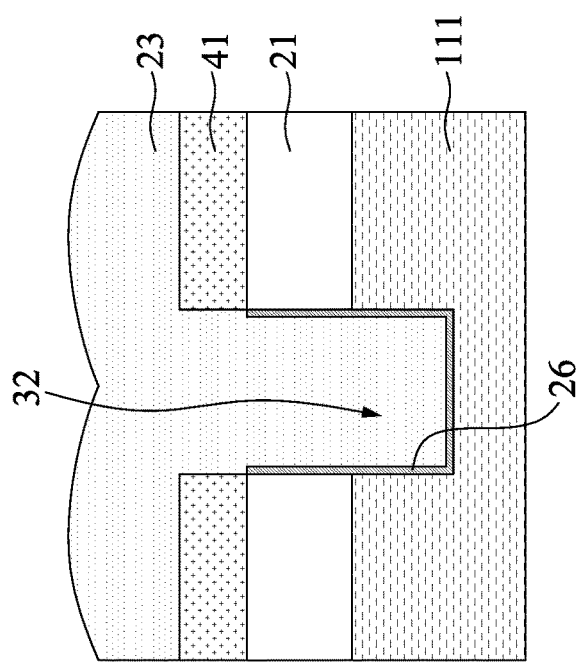
Figure 14C:
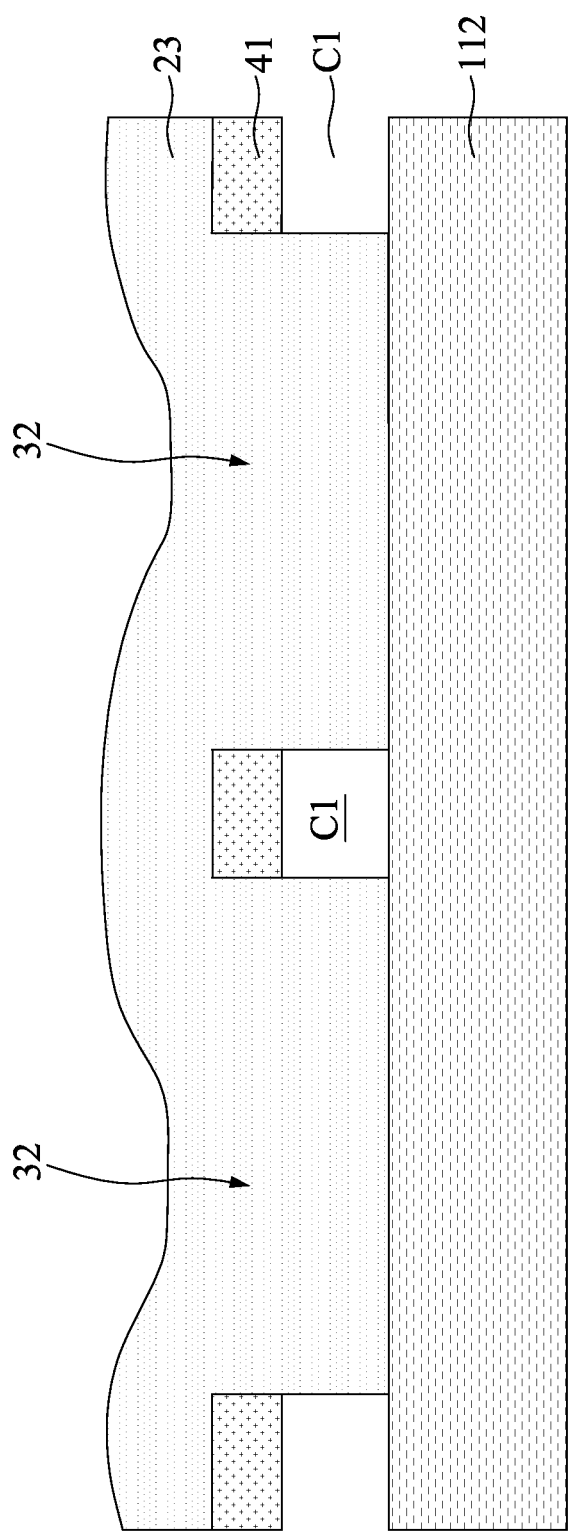

Referring to FIGS. 14A, 14B and 14C, the photoresist layer 5 is removed, and a third dielectric layer 23 is formed over the substrate 1. In some embodiments, a gap fill operation is performed. In some embodiments, the gap fill operation is achieved by a deposition. In some embodiments, the deposition includes chemical vapor deposition (CVD), atomic layer deposition (ALD), plasma-enhanced chemical vapor deposition (PECVD), plasma-enhanced atomic layer deposition (PEALD), or a combination thereof.

In some embodiments, the third dielectric layer 23 fills the first recess 31 and an opening in the first mask layer 41 over the first recess 31. In some embodiments, the third dielectric layer 23 contacts the first conformal layer 26. In some embodiments, the third dielectric layer 23 fills the third opening 32 over the second dielectric layer 22. In some embodiments, the third dielectric layer 23 contacts the second dielectric layer 22. In some embodiments, a dielectric material of the third dielectric layer 23 and a dielectric material of the second dielectric layer 22 are the same. In some embodiments, the third dielectric layer 23 includes oxide.

In some embodiments, the third dielectric layer 23 is directly over portions of the even-numbered protruding portions 112 and 114 (as shown in FIG. 2), wherein the portions of the even-numbered protruding portions 112 and 114 are overlapped by or vertically exposed by the third openings 32. Due to a property of the deposition, as shown in FIG. 14C, the third dielectric layer 23 does not entirely fill a space between the protruding portion 112 and the first mask layer 41. In some embodiments, the third dielectric layer 23 contacts the portion of the protruding portion 112 vertically overlapped by the third opening 32 as shown in FIG. 14C. Multiple cavities C1 are thereby defined by the third dielectric layer 23, the first mask layer 41 and the protruding portion 112 of the substrate 1. In some embodiments, an excess portion of the third dielectric layer 23 is formed above and covers the first mask layer 41 due to a property of the deposition.

Figure 15B:
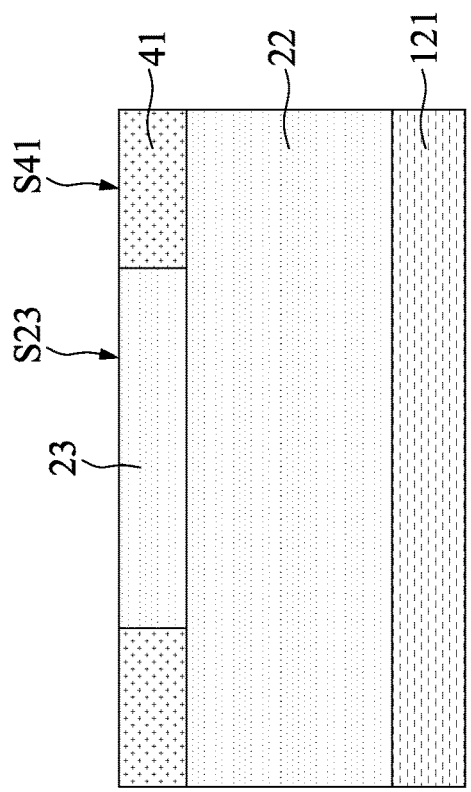
Figure 15A:
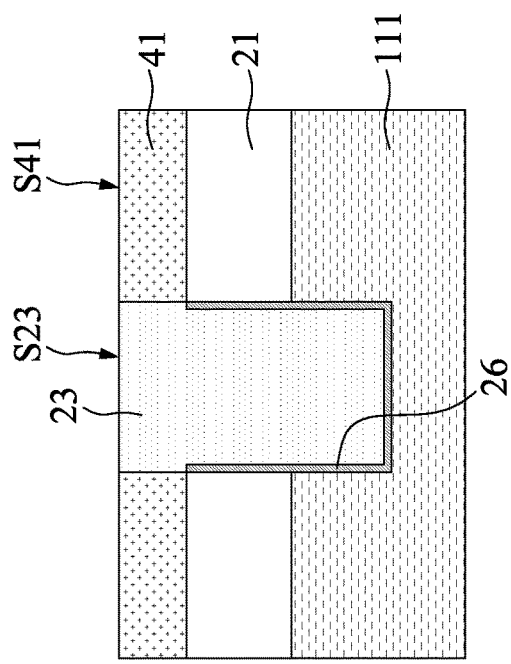
Figure 15C:
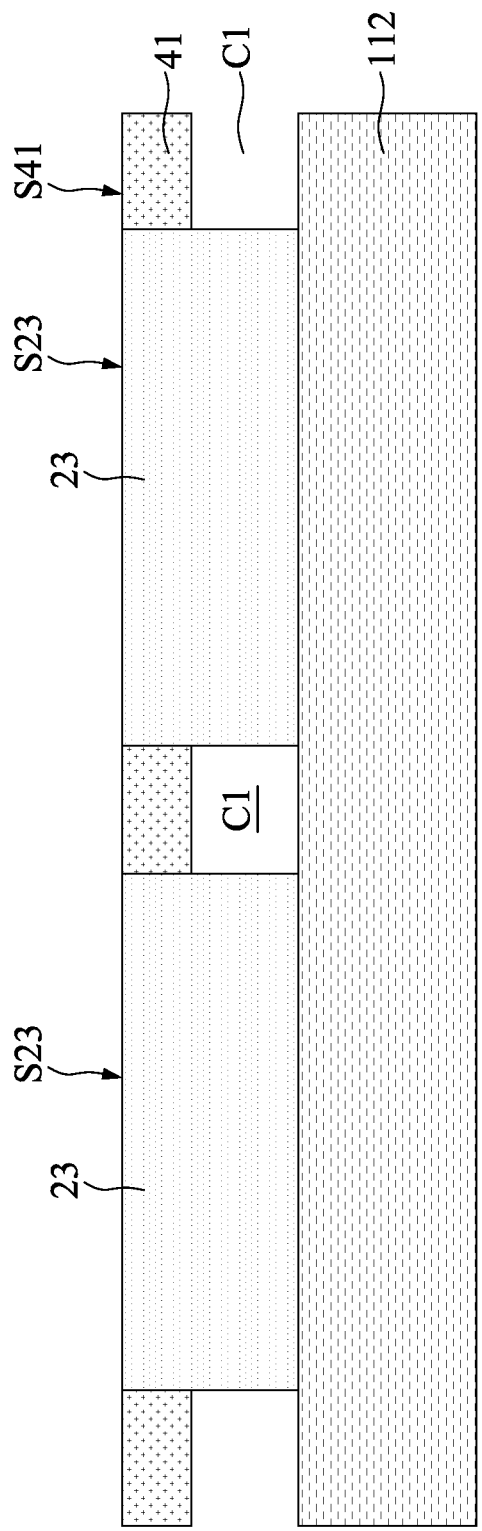

Referring to FIGS. 15A, 15B and 15C, a planarization is performed to remove the excess portion of the third dielectric layer 23 above the first mask layer 41. In some embodiments, the planarization includes a chemical mechanical polishing (CMP), a time-mode etching operation, or a combination thereof. In some embodiments, the first mask layer 41 functions as a stop layer of the CMP or the etching operation. In some embodiments, a top surface S23 of the third dielectric layer 23 is substantially aligned with or coplanar with a top surface S41 of the first mask layer 41.

Figure 16A:
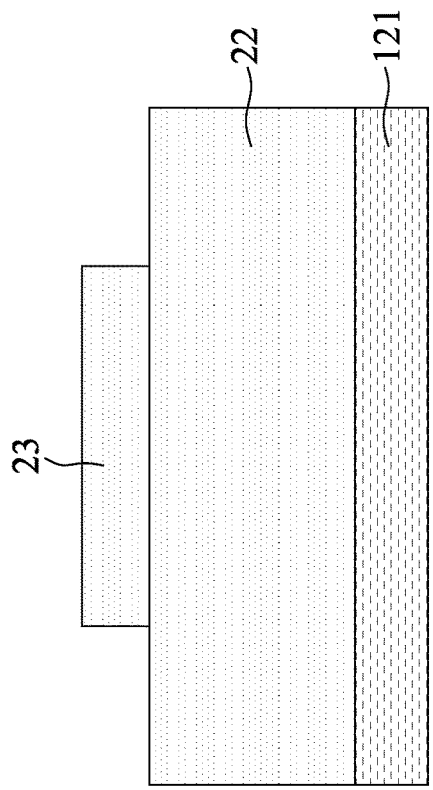
Figure 16B:
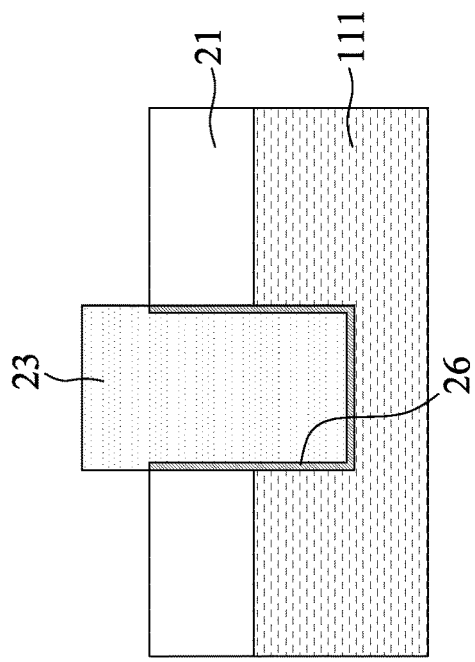
Figure 16C:
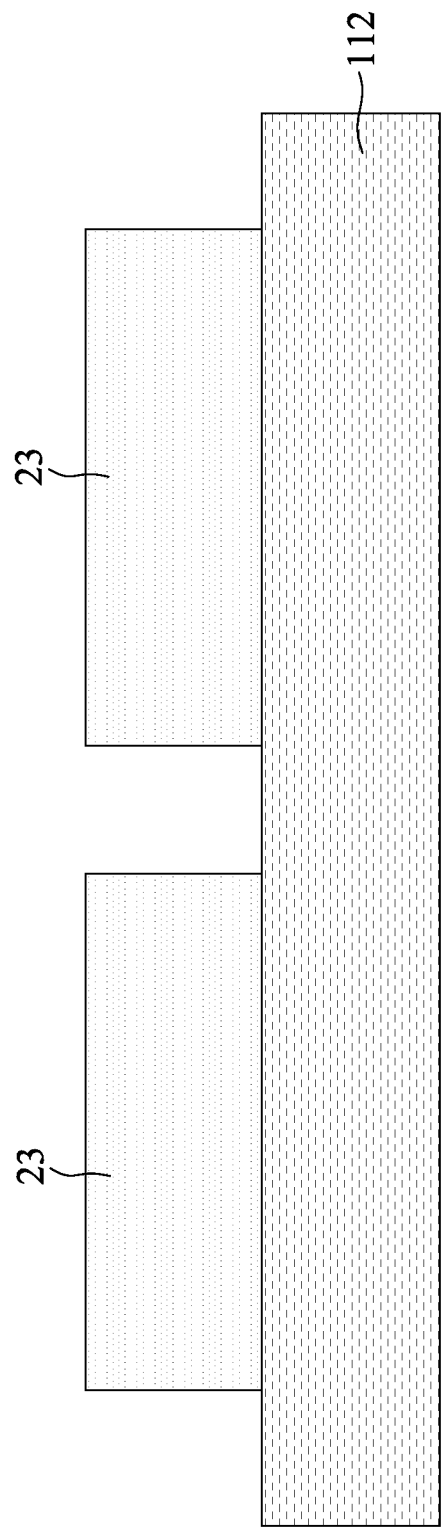

Referring to FIGS. 16A, 16B and 16C, the first mask layer 41 is removed. In some embodiments, the first mask layer 41 is removed by an etching operation. In some embodiments, the cavities C1 shown in FIG. 15C are revealed or exposed. In some embodiments, the odd-numbered protruding portions 111, 113 and 115 shown in FIG. 2 are covered by the third dielectric layer 23 and the first dielectric layer 21 as shown in FIG. 16A. In some embodiments, the recessed portions 12 shown in FIG. 2 remain covered by the second dielectric layer 22, and portions of the second dielectric layer 22 within coverage areas of the second openings 52 as shown in FIG. 8 are covered by the third dielectric layer 23 as shown in FIG. 16B. In some embodiments, portions of the even-numbered protruding portions 112 and 114 within coverage areas of the second openings 52 shown in FIGS. 2 and 8 are covered by the third dielectric layer 23 as shown in FIG. 16C. In some embodiments, remaining portions of the even-numbered protruding portions 112 and 114 outside the coverage areas of the second openings 52 as shown in FIGS. 2 and 8 are exposed through the third dielectric layer 23 as shown in FIG. 16C.

Figure 17C:
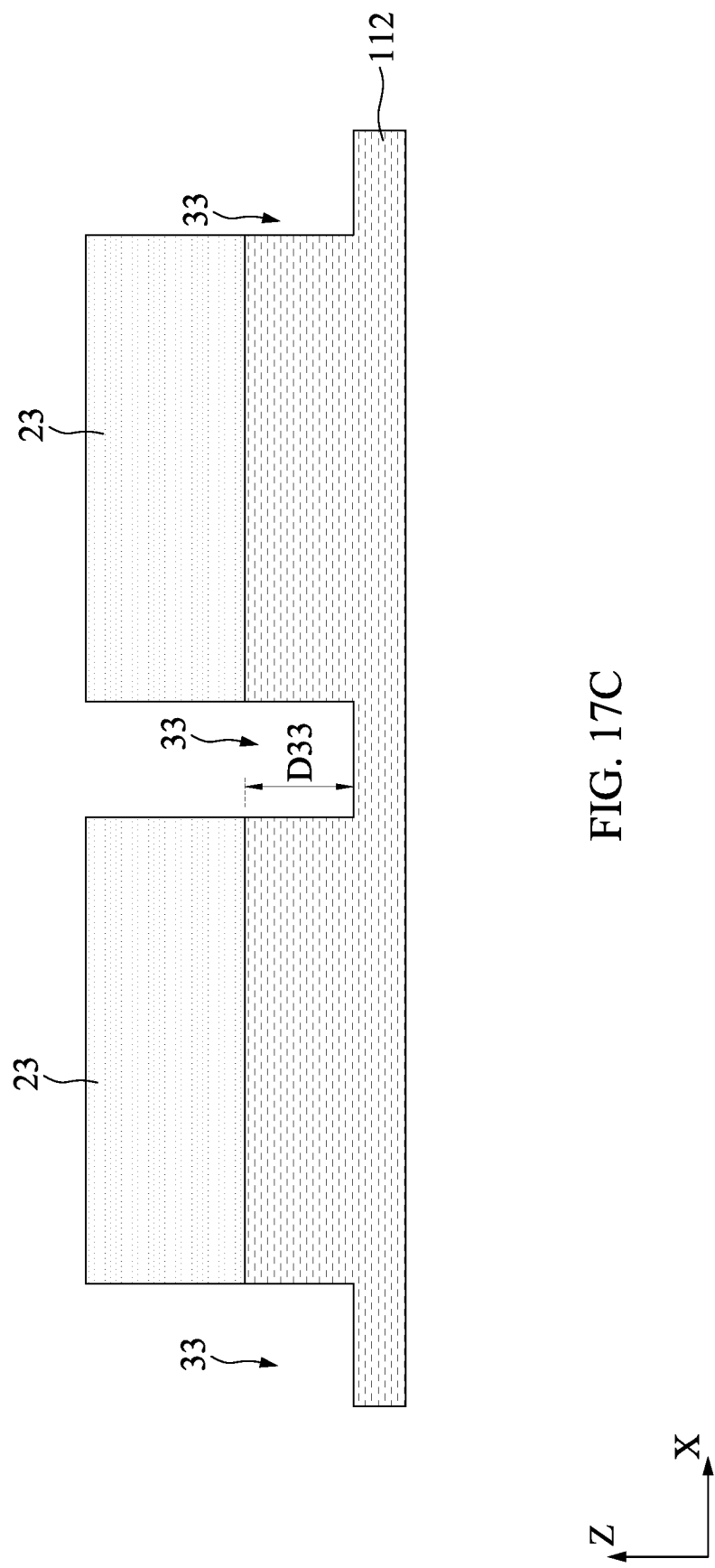

Referring to FIGS. 17A, 17B and 17C, an etching operation is performed to remove the portions of the protruding portions 11 exposed through the third dielectric layer 23. In some embodiments, an etchant used in the etching operation has a high selectivity to silicon material. In some embodiments, the first dielectric layer 21, the second dielectric layer 22 and the third dielectric layer 23 are used as a mask in the etching operation. In some embodiments, a plurality of second recesses 33 are formed by the etching operation. In some embodiments, a depth D33 of the second recess 33 is in a range of 0.1 to 1 μm. In some embodiments, the depth D33 is substantially equal to the depth D31 shown in FIG. 10A or the depth D12 shown in FIG. 3.

Figure 18:
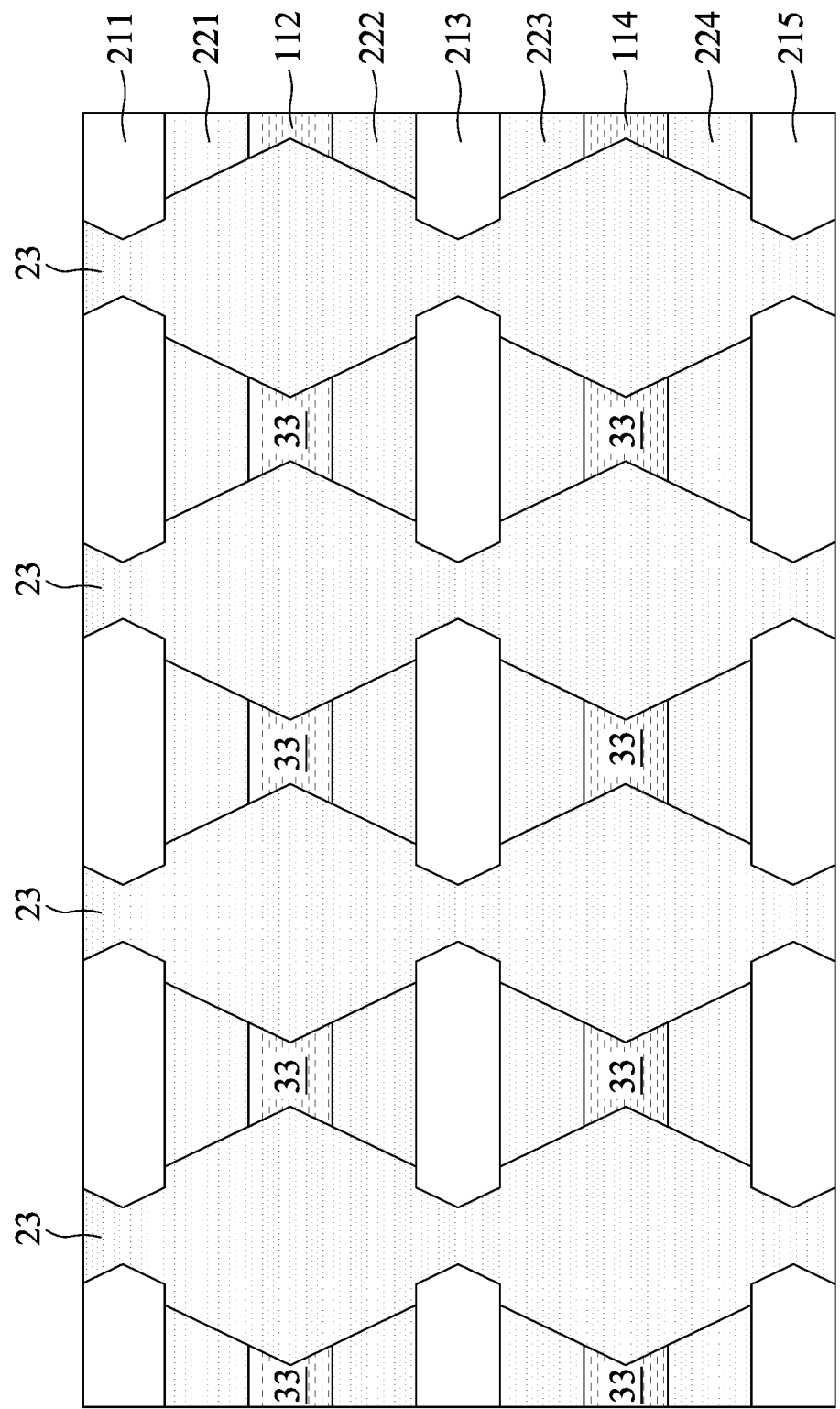
FIG. 18 is a schematic top-view diagram at a stage of a method shown in FIGS. 17A, 17B and 17C in accordance with some embodiments of the present disclosure.

FIG. 18 is a top view of the stage of FIGS. 17A, 17B and 17C of the method of the present disclosure in accordance with some embodiments. In some embodiments, the third dielectric layer 23 has a configuration similar to or substantially same as configurations of the first and second openings 51 and 52 shown in FIG. 8. In some embodiments, the odd-numbered first segments 211, 213 and 215 of the first dielectric layer 21 are left remaining. In some embodiments, the first dielectric layer 21 is penetrated by the third dielectric layer 23 as shown in FIG. 17A at positions of the first openings 51 as shown in FIGS. 8 and 18. In some embodiments, portions of the even-numbered protruding portions 112 and 114 are partially exposed through the third dielectric layer 23. In some embodiments, the second recesses 33 of the protruding portions 112 and 114 are defined by the third dielectric layer 23.

Figure 19B:
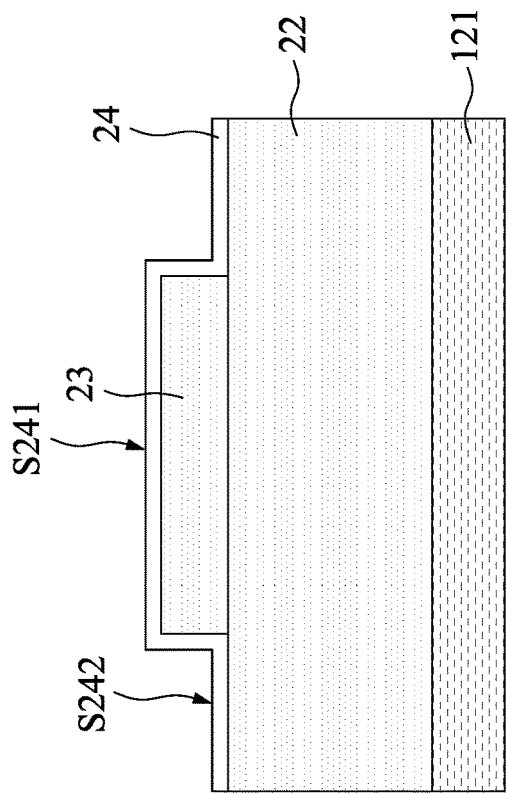
Figure 19A:
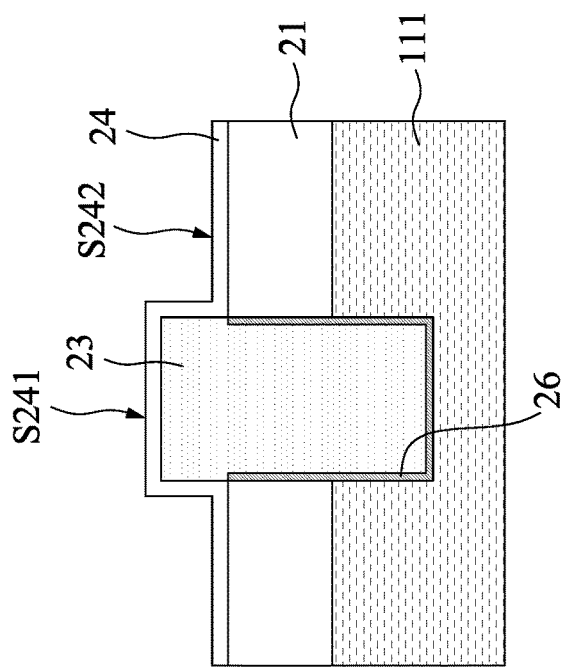
Figure 19C:
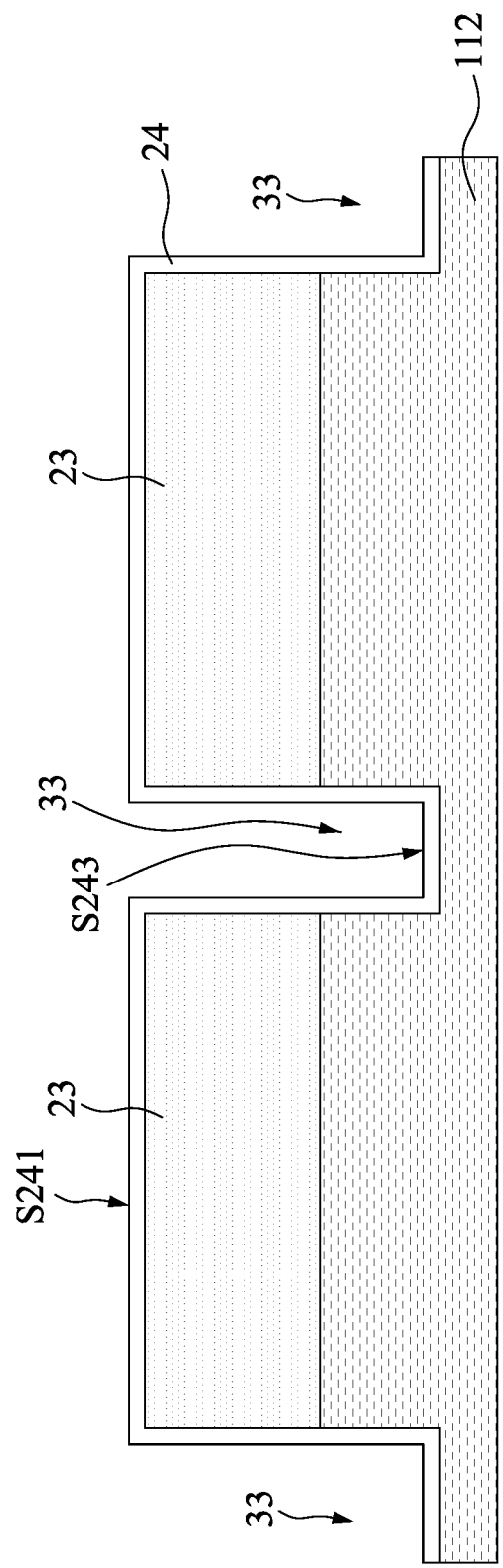

Referring to FIGS. 19A, 19B and 19C, a second conformal layer 24 is formed over the first dielectric layer 21, the second dielectric layer 22, the third dielectric layer 23, and the substrate 1. In some embodiments, the second conformal layer 24 is formed by a conformal deposition. In some embodiments, the conformal deposition includes ALD, PEALD, or a combination thereof. In some embodiments, the second conformal layer 24 includes a dielectric material similar to or same as the dielectric material of the first dielectric layer 21. In some embodiments, the second conformal layer 24 includes nitride. In some embodiments, the second conformal layer 24 lines the second recesses 33.

The second conformal layer 24 includes multiple horizontal portions as shown in FIGS. 19A, 19B and 19C, and the multiple horizontal portions define three horizontal levels. In some embodiments, a first horizontal level S241 is defined by horizontal portions of the second conformal layer 24 disposed over the third dielectric layer 23. In some embodiments, a second horizontal level S242 is defined by horizontal portions of the second conformal layer 24 disposed over the first dielectric layer 21 and the second dielectric layer 22. In some embodiments, a third horizontal level S243 is defined by horizontal portions of the second conformal layer 24 disposed at a bottom of the recess 33.

Figure 20B:
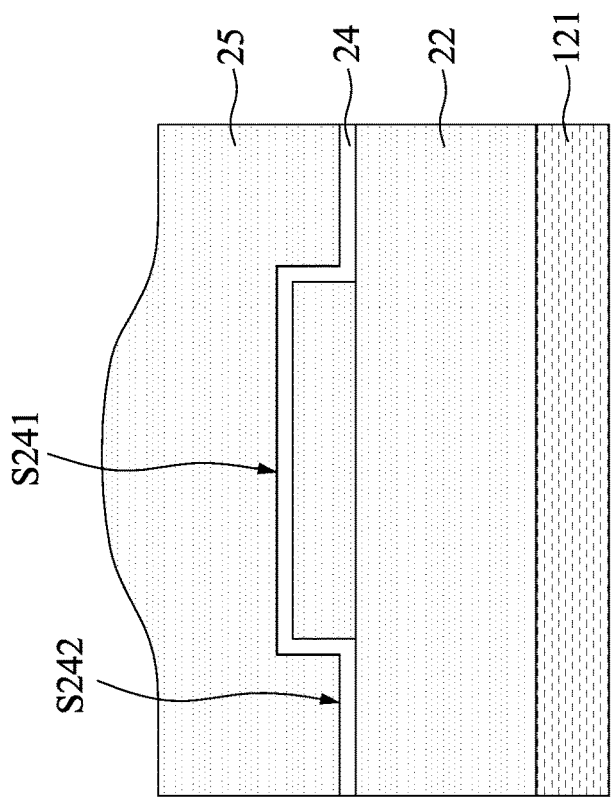
Figure 20A:
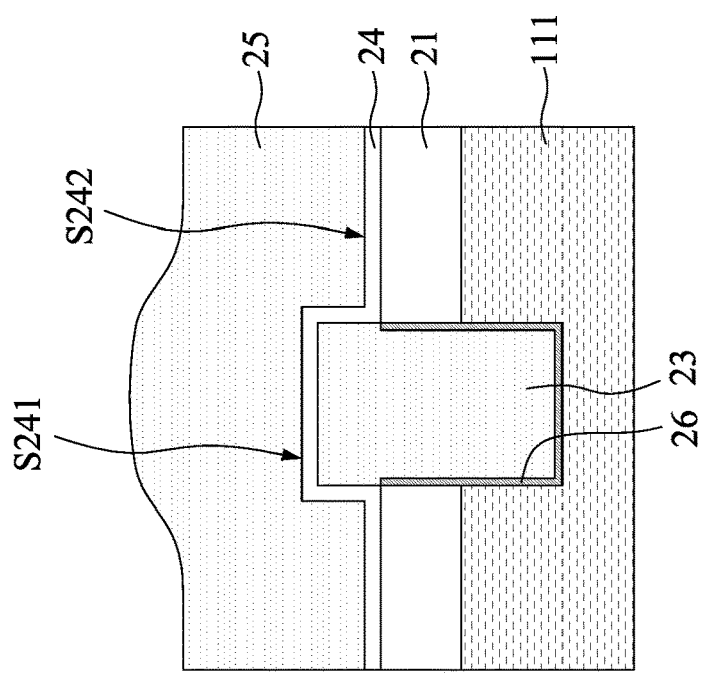
Figure 20C:
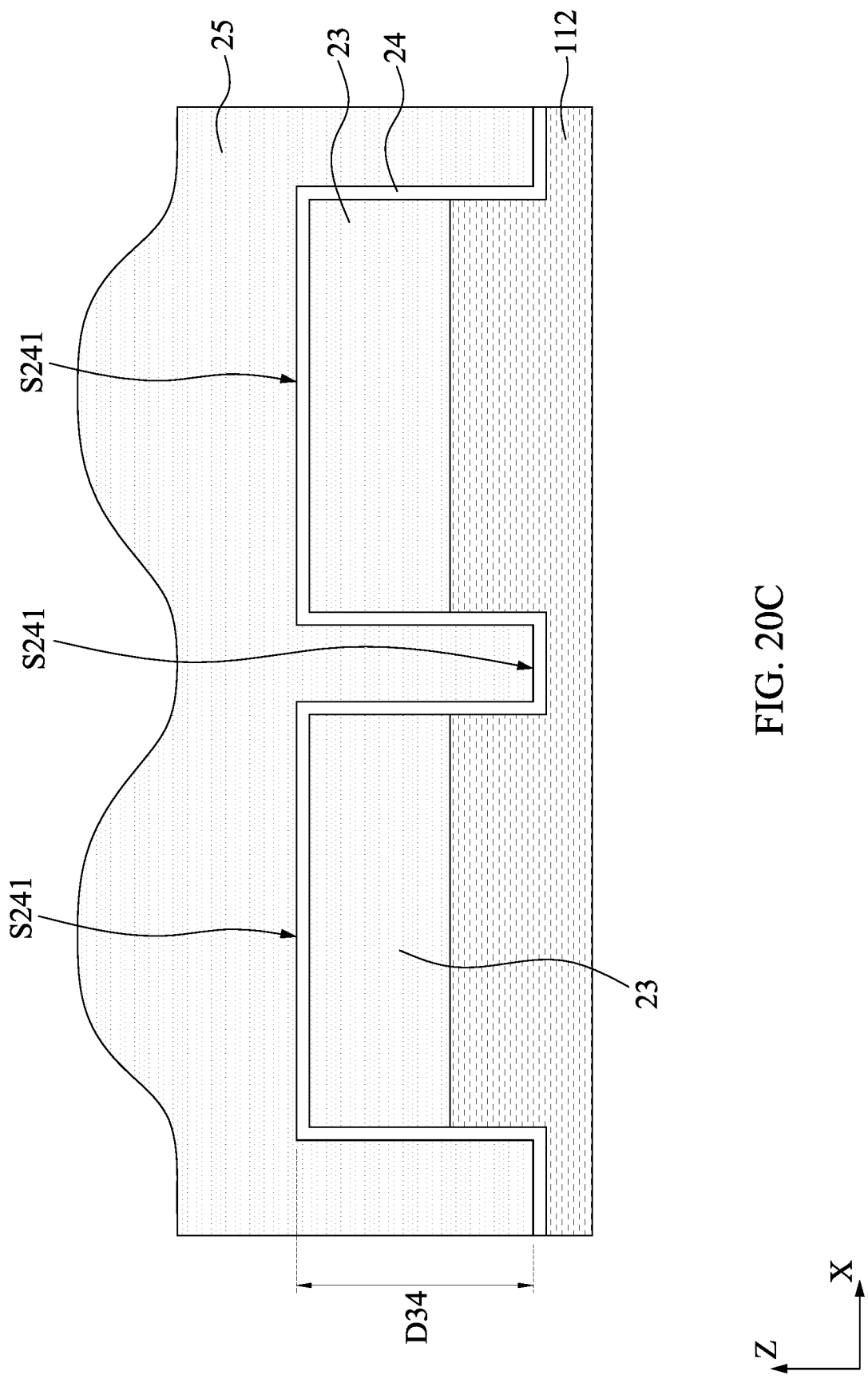

Referring to FIGS. 20A, 20B and 20C, a fourth dielectric layer 25 is formed over the second conformal layer 24. In some embodiments, the fourth dielectric layer 25 is formed by a conformal deposition. In some embodiments, the conformal deposition includes CVD, ALD, PVD, PEALD, or a combination thereof. In some embodiments, the fourth dielectric layer 25 includes a dielectric material similar to or same as the dielectric material of the second dielectric layer 22. In some embodiments, the fourth dielectric layer 25 includes oxide. In some embodiments, the fourth dielectric layer 25 fills the second recess 33. In some embodiments, a thickness of the fourth dielectric layer 25 is substantially equal to or greater than a total depth D34 of a thickness of the third dielectric layer 23 and the depth D33 of the recess 33 as shown in FIG. 17C to ensure that the fourth dielectric layer 25 fills the recesses 33 and an opening in the third dielectric layer 23.

Figure 21A:
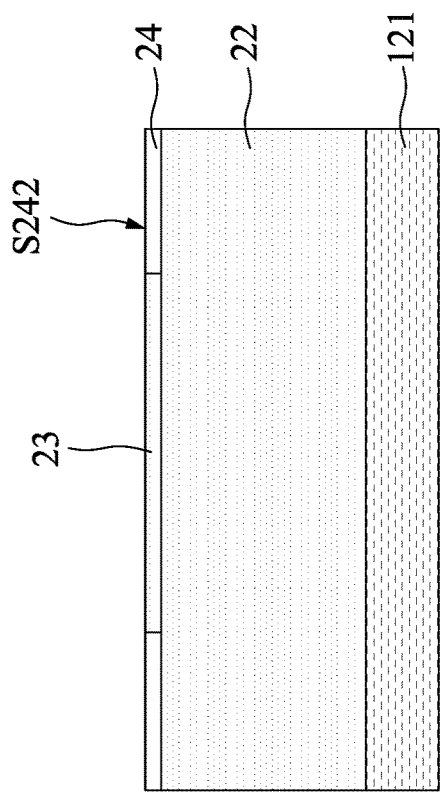
Figure 21B:
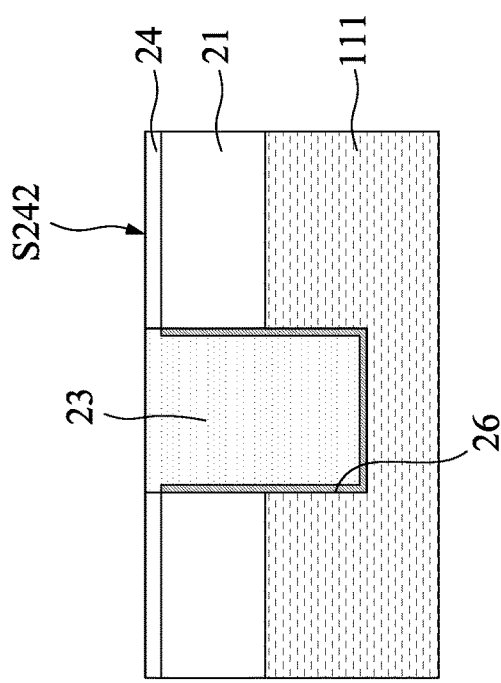
Figure 21C:
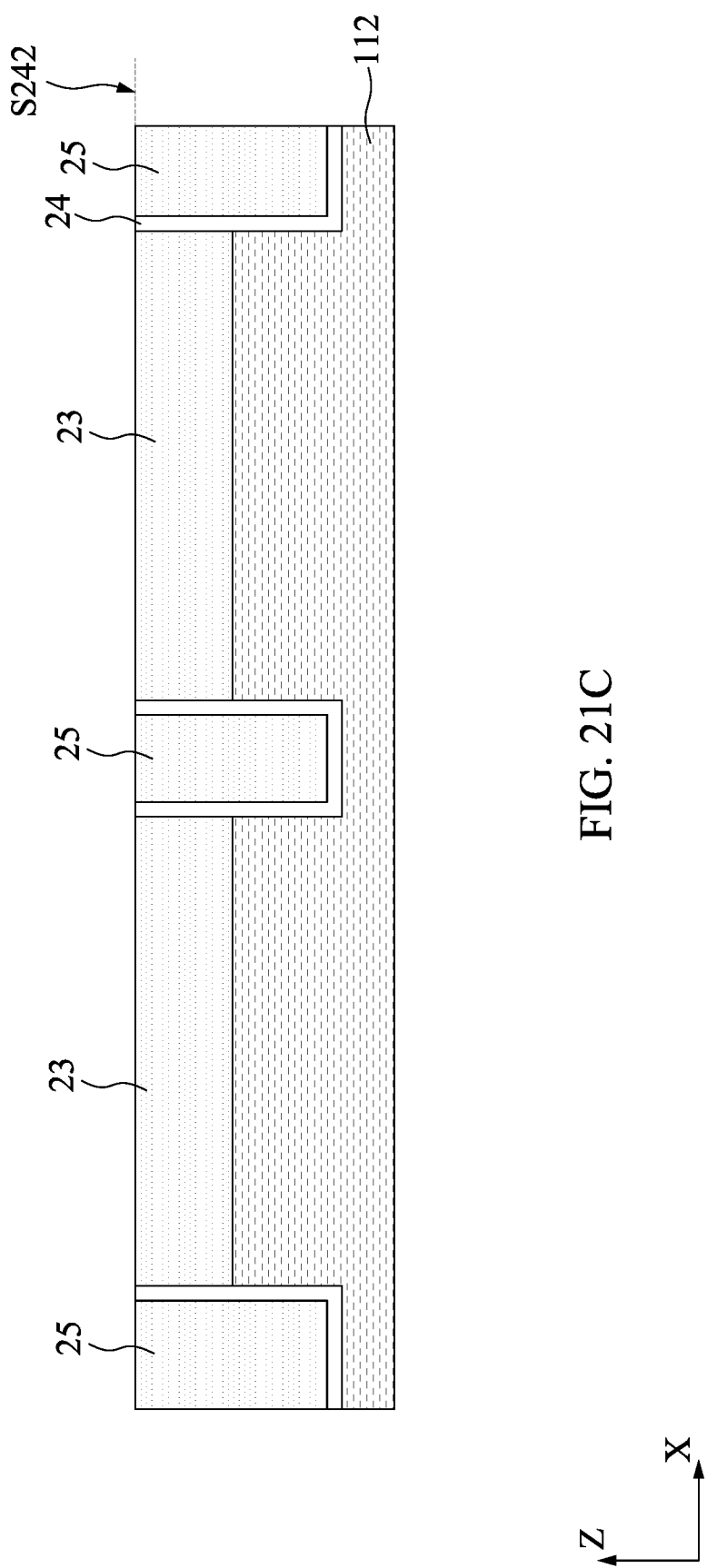

Referring to FIGS. 21A, 21B and 21C, a planarization is performed and stops on the second horizontal level S242 of the second conformal layer 24. In some embodiments, the planarization includes CMP, an etching operation, or a combination thereof. In some embodiments, an etchant of the etching operation has a high selectivity to oxide materials and a low selectivity to nitride materials. In some embodiments, the etching operation removes portions of the second conformal layer 24 above the second horizontal level S242 due to a small coverage area of the portions of the second conformal layer 24 above the second horizontal level S242. In some embodiments, a ratio of a surface area of the second conformal layer 24 to the surface area of the fourth dielectric layer 25 at the first horizontal level S241 shown in FIGS. 20A, 20B and 20C is very small, and the etching operation can remove portions of the second conformal layer 24 at the first horizontal level S241. In some embodiments, the etching operation is easily controlled to stop at the second horizontal level S242 due to a high ratio of a surface area of the second conformal layer 24 to a surface area the fourth dielectric layer 25 at the second horizontal level S241.

Figure 22C:
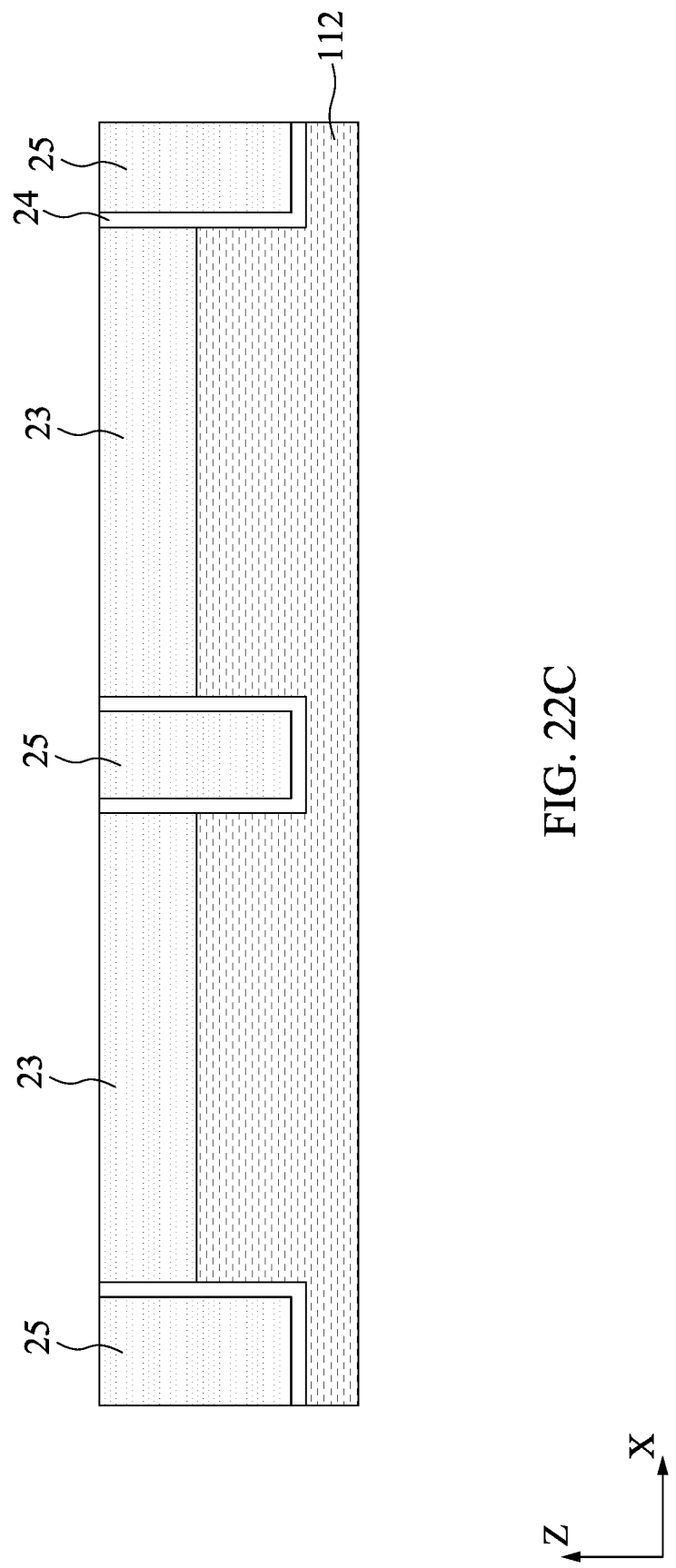

Referring to FIGS. 22A, 22B and 22C, the first dielectric layer 21 is removed. In some embodiments, an etching operation is performed to remove the first dielectric layer 21. In some embodiments, an etchant of the etching operation includes a high selectivity to nitride materials. In some embodiments, the second conformal layer 24 remains between the third dielectric layer 23 and the fourth dielectric layer 25.

Figure 23:
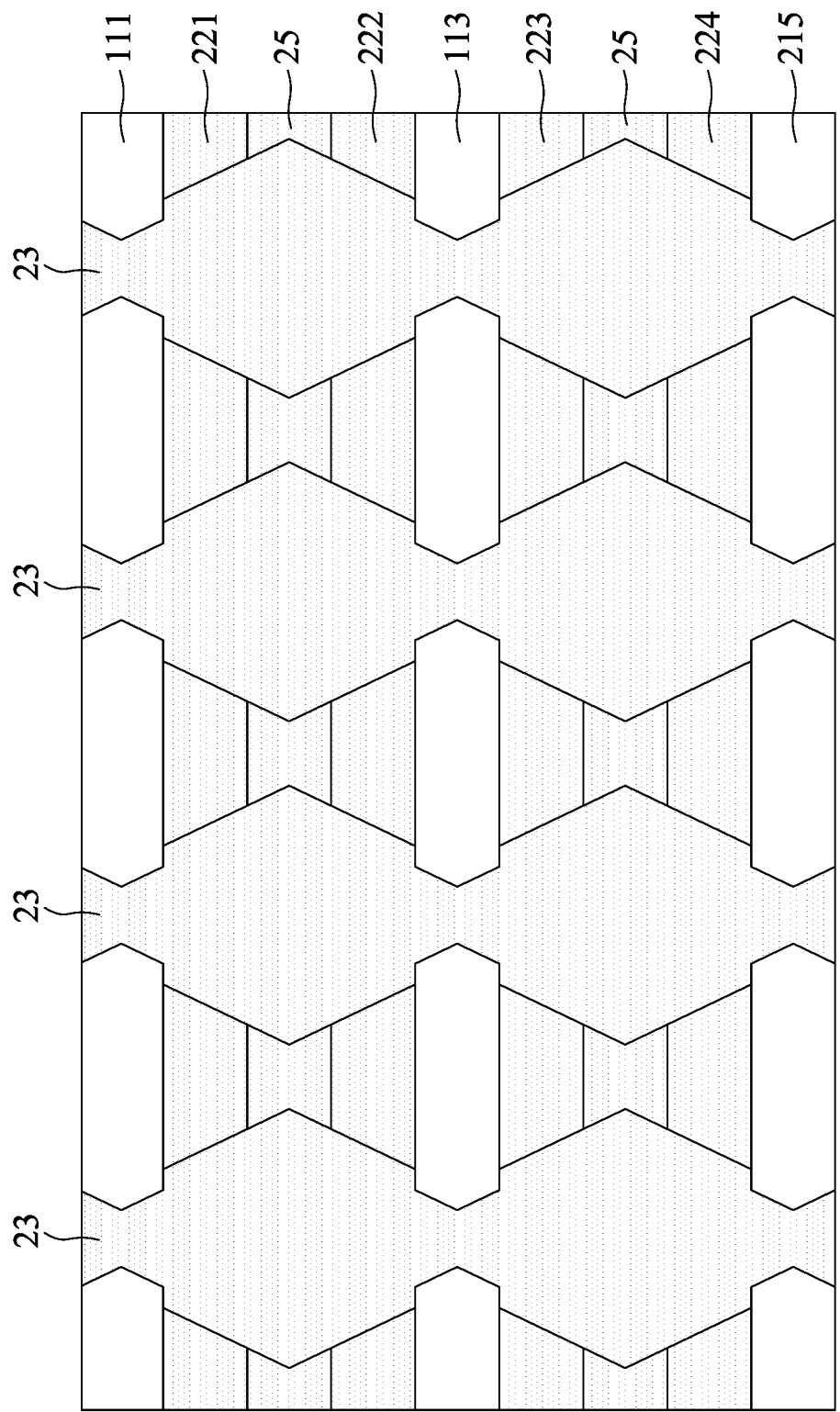
FIG. 23 is a schematic top-view diagram at a stage of a method shown in FIGS. 22A, 22B and 22C in accordance with some embodiments of the present disclosure.

FIG. 23 is a top view of the stage of FIGS. 22A, 22B and 22C of the method of the present disclosure in accordance with some embodiments. In some embodiments, the odd-numbered protruding portions 111, 113 and 115 are exposed through the third dielectric layer 23. In some embodiments, the second dielectric layer 22 is left remaining over the substrate 1. In some embodiments, the even-numbered protruding portions 112 and 114 shown in FIG. 2 are covered by the fourth dielectric layer 25 and the third dielectric layer 23.

Figure 24C:
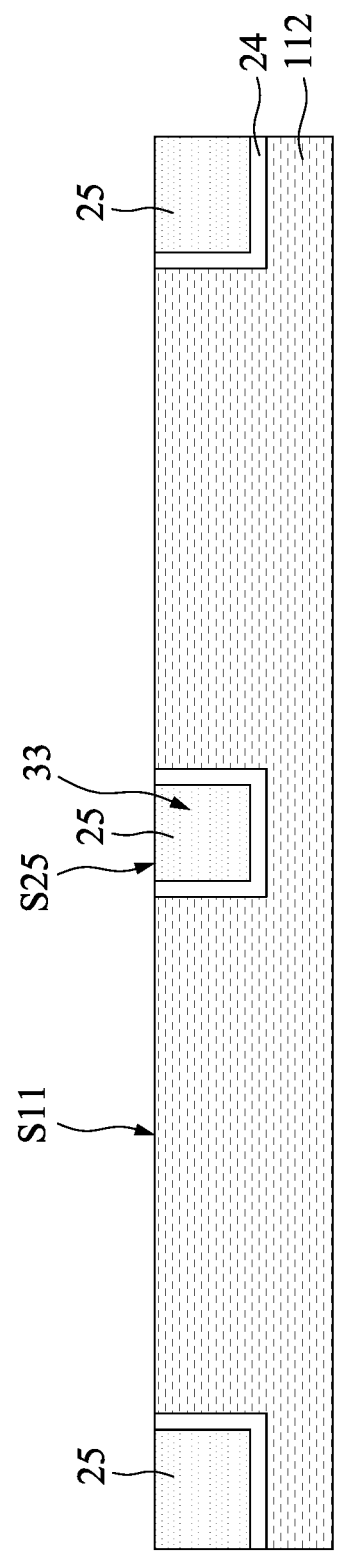

Referring to FIGS. 24A, 24B and 24C, the protruding portions 11 are exposed. In some embodiments, portions of the second dielectric layer 22, the third dielectric layer 23 and the fourth dielectric layer 25 are removed to expose the protruding portions 11. In some embodiments, an etching operation is performed. In some embodiments, the etching operation stops at the top surface S11 of the protruding portions 11. In some embodiments, portions of the third dielectric layer 23 over the odd-numbered protruding portions 111, 113 and 115 are partially removed as shown in FIG. 24A. In some embodiments, a thickness of the second dielectric layer 22 is reduced to align a top surface of the second dielectric layer 22 with the top surface S11 of the protruding portions 11 as shown in FIG. 24B. In some embodiments, portions of the fourth dielectric layer 25 and the second conformal layer 24 above the third recesses 33 are removed. In some embodiments, a top surface S25 of the fourth dielectric layer 25 is substantially aligned with or coplanar with the top surface S11 of the protruding portions 11.

FIG. 25 is a top view of the stage of FIGS. 24A, 24B and 24C of the method of the present disclosure in accordance with some embodiments. The exposed portions of the protruding portions 11 become active areas AA of a semiconductor structure. In some embodiments, each active area AA may have a hexagonal configuration. In some embodiments, the third dielectric layer 23 and the fourth dielectric layer 25 are for a purpose of electrical isolation between adjacent active areas AA along the second direction. In some embodiments, the second dielectric layer 22 is for a purpose of electrical isolation between the active areas AA along the first direction. It should be noted that, theoretically or ideally, the active areas AA are hexagons with sharp corners. In practice, however, the corners of the hexagons of the active areas should be rounded due to a property of lithography. The active area AA protrudes toward a concave portion 231 of the second dielectric layer 23 or a concave portion 251 of the fourth dielectric layer 25, and regions of the active area AA protruding toward the concave portion 231 or the concave portion 251 can provide extra surface area for passive elements (e.g., capacitors), wiring, routing, landing pads, or other electrical components. In addition, it is known that electric fields can easily accumulate at corners with sharp angles, and the hexagonal configurations of active areas can reduce a possibility of current leakage and accumulation of electric fields.

The present disclosure provides a method for defining active areas of a semiconductor structure. The method includes formation of a patterned mask layer (e.g., the photoresist layer 5) having an opening (e.g., the openings 51 and 52) with a wavy sidewall and various widths along a direction orthogonal to an extending direction of an active area to be formed. Materials with different photosensitivities are used to achieve a result of multiple patterning operations on different materials, and therefore the active areas on different rows can be defined by different patterning operations.

To conclude the operations as illustrated in FIGS. 1 to 25 above, a method S10, a method S20, and a method S30 within a same concept of the present disclosure are provided.

Figure 28:
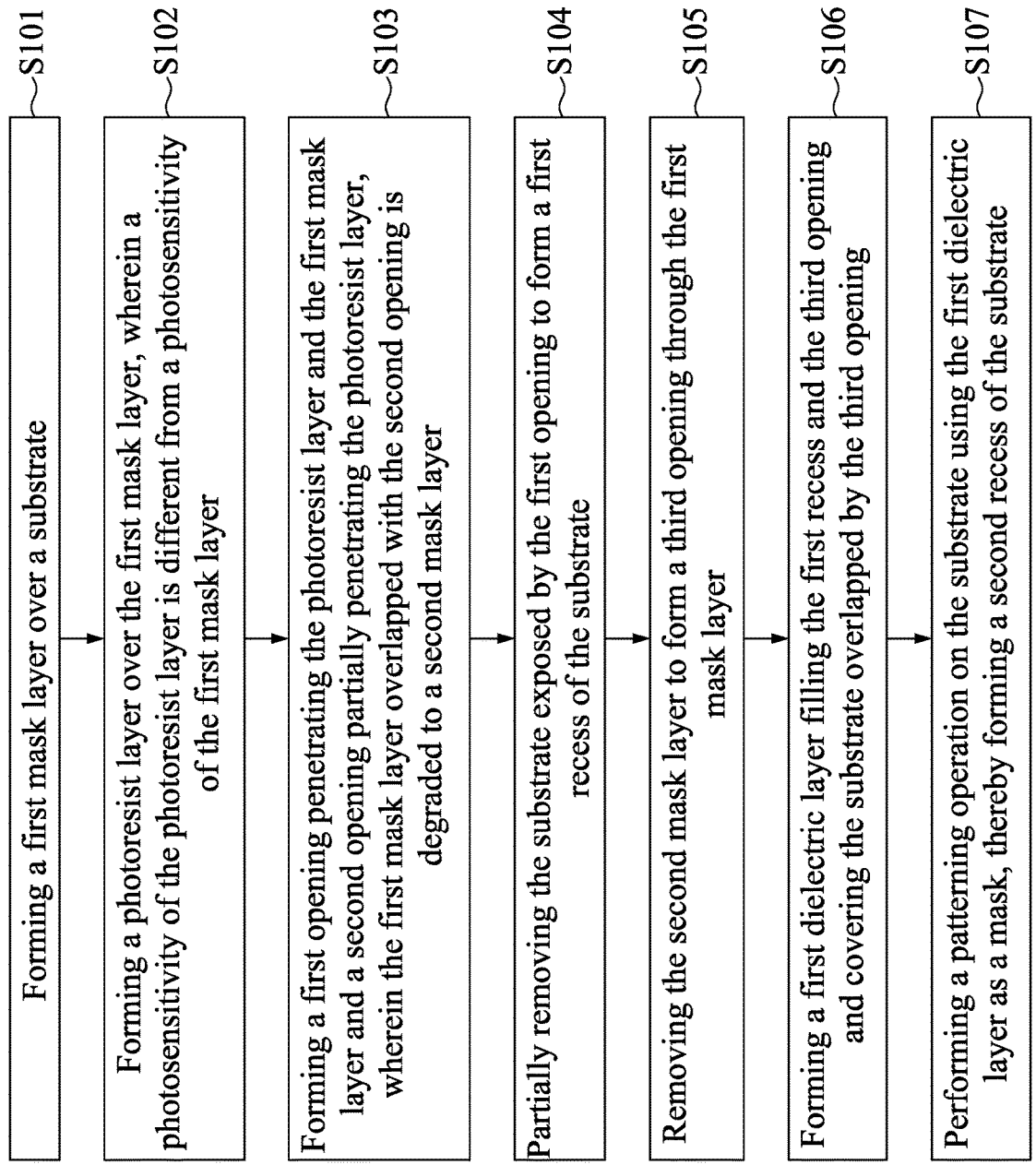
FIGS. 28, 29 and 30 are flow diagrams illustrating methods for manufacturing a semiconductor structure in accordance with some embodiments of the present disclosure.

FIG. 28 is a flow diagram illustrating a method S10 for manufacturing a semiconductor structure in accordance with some embodiments of the present disclosure. The method S10 includes a number of operations (S101, S102, S103, S104, S105, S106 and S107) and the description and illustration are not deemed as a limitation to the sequence of the operations. In the operation S101, a first mask layer is formed over a substrate. In the operation S102, a photoresist layer is formed over the first mask layer, wherein a photosensitivity of the photoresist layer is different from a photosensitivity of the first mask layer. In the operation S103, a first opening and a second opening are formed, wherein the first opening penetrates the photoresist layer and the first mask layer, the second opening partially penetrates the photoresist layer, and a portion of the first mask layer overlapped by the second opening is degraded to form a second mask layer. In the operation S104, a portion of the substrate exposed by the first opening is partially removed to form a first recess of the substrate. In the operation S105, the second mask layer is removed to form a third opening through the first mask layer. In the operation S106, a first dielectric layer is formed, wherein the first dielectric layer fills the first recess and the third opening and covers a portion of the substrate overlapped by the third opening. In the operation S107, a patterning operation is performed on the substrate using the first dielectric layer as a mask, and a second recess of the substrate is thereby formed.

Figure 29:
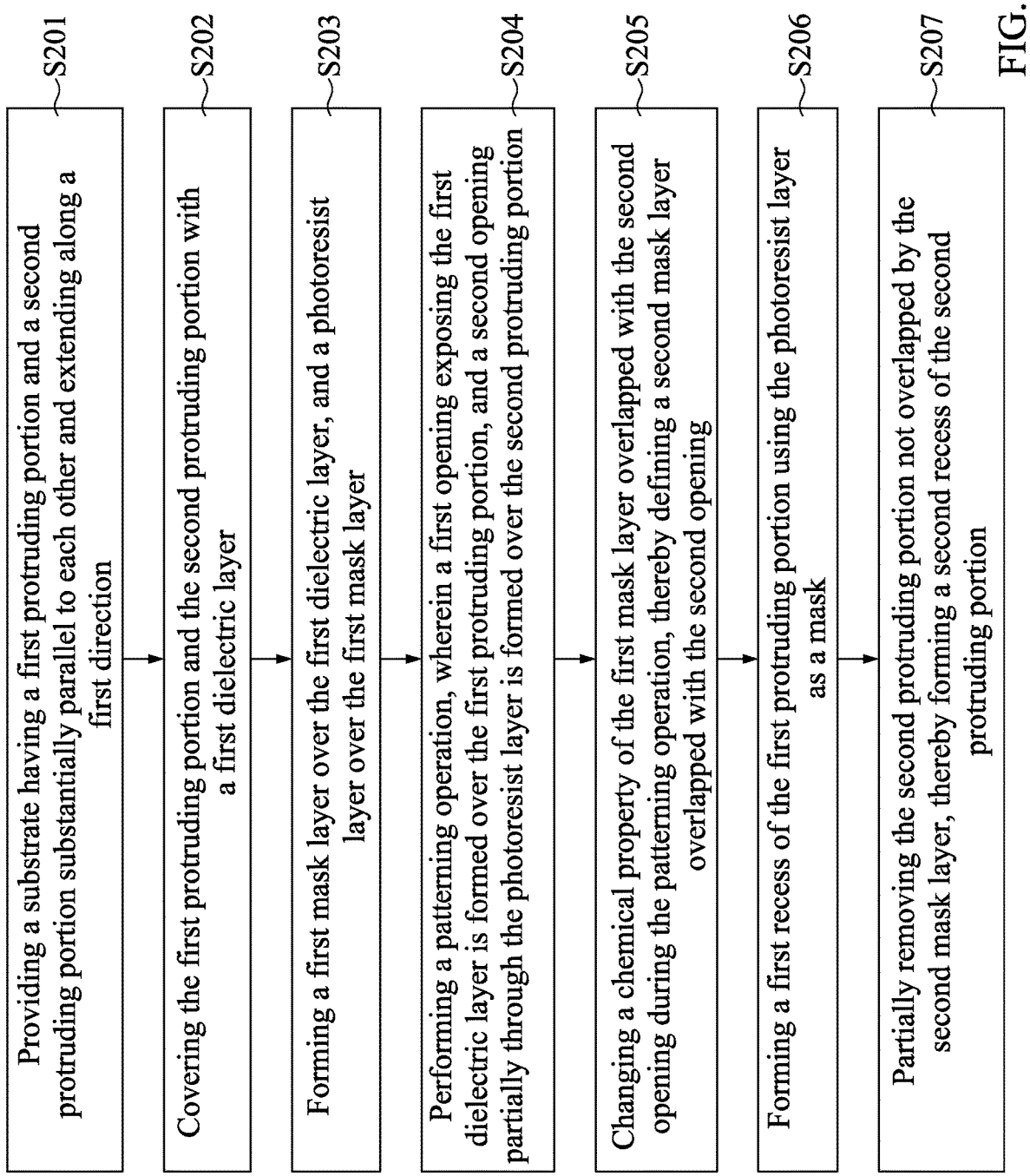

FIG. 29 is a flow diagram illustrating a method S20 for manufacturing a semiconductor structure in accordance with some embodiments of the present disclosure. The method S20 includes a number of operations (S201, S202, S203, S204, S205, S206 and S207) and the description and illustration are not deemed as a limitation to the sequence of the operations. In the operation S201, a substrate is provided, wherein the substrate includes a first protruding portion and a second protruding portion substantially parallel to each other and extending along a first direction. In the operation S202, the first protruding portion and the second protruding portion are covered by a first dielectric layer. In the operation S203, a first mask layer is formed over the first dielectric layer, and a photoresist layer is formed over the first mask layer. In the operation S204, a patterning operation is performed, wherein a first opening is formed in the first mask layer and the photoresist layer over the first protruding portion and exposing the first dielectric layer, and a second opening is formed partially through the photoresist layer over the second protruding portion. In the operation S205, a chemical property of a portion of the first mask layer overlapped by the second opening is changed during the patterning operation, and a second mask layer overlapped by the second opening is thereby defined. In the operation S206, a first recess of the first protruding portion is formed using the photoresist layer as a mask. In the operation S207, a portion of the second protruding portion not overlapped by the second mask layer is partially removed, and a second recess of the second protruding portion is thereby formed.

Figure 30:
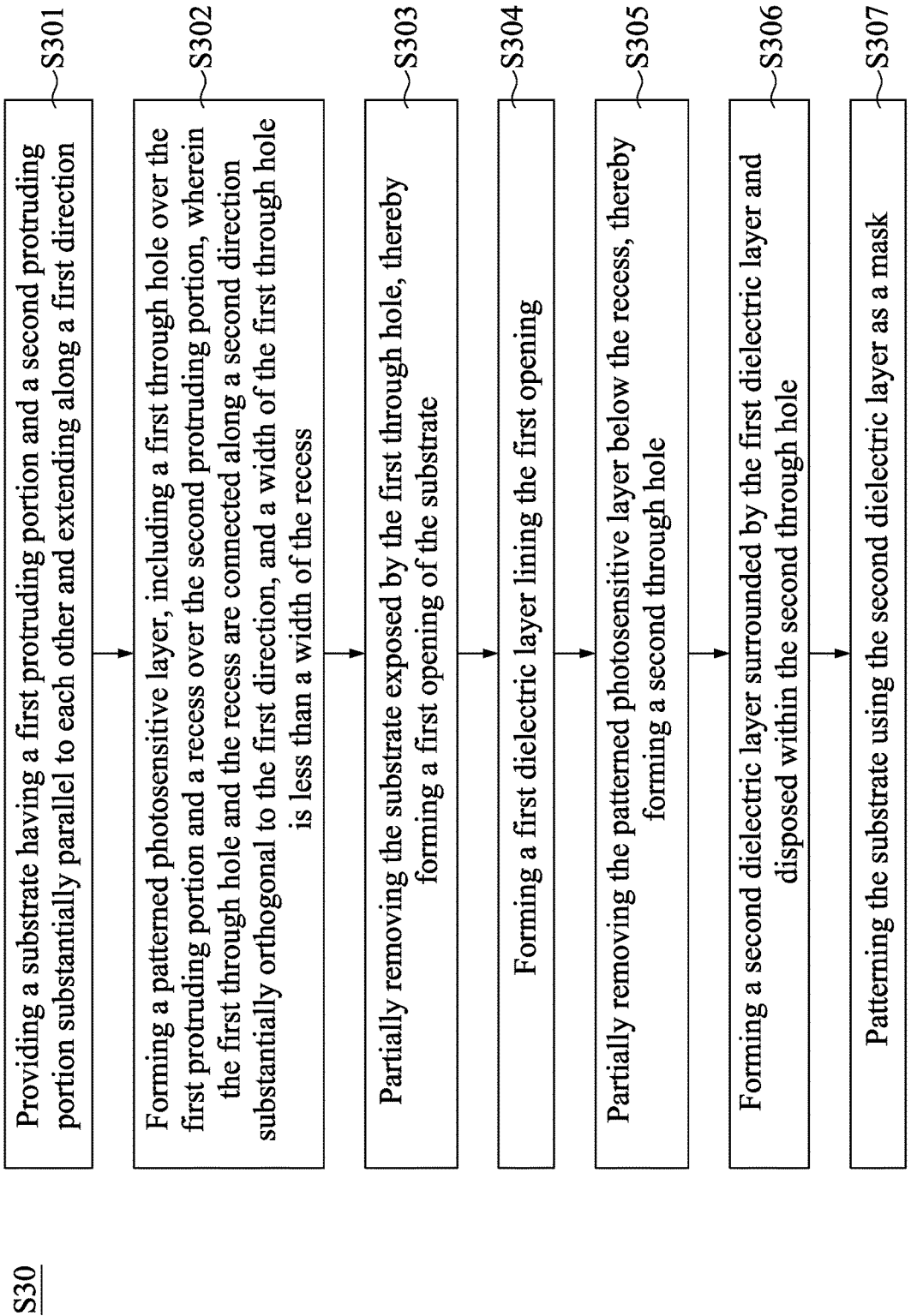

FIG. 30 is a flow diagram illustrating a method S30 for manufacturing a semiconductor structure in accordance with some embodiments of the present disclosure. The method S30 includes a number of operations (S301, S302, S303, S304, S305, S306 and S307) and the description and illustration are not deemed as a limitation to the sequence of the operations. In the operation S301, a substrate is provided, wherein the substrate includes a first protruding portion and a second protruding portion, and the first and second protruding portions extend along a first direction. In the operation S302, a patterned photosensitive layer is formed, wherein the patterned photosensitive layer includes a first through hole over the first protruding portion and a recess over the second protruding portion, wherein the first through hole and the recess are connected along a second direction substantially orthogonal to the first direction, and a width of the first through hole is less than a width of the recess. In the operation S303, a portion of the substrate exposed by the first through hole is partially removed, and a first opening of the substrate is thereby formed. In the operation S304, a first dielectric layer lining the first opening is formed. In the operation S305, a portion of the patterned photosensitive layer below the recess is partially removed, and a second through hole is thereby formed. In the operation S306, a second dielectric layer surrounded by the first dielectric layer and disposed within the second through hole is formed. In the operation S307, the substrate is patterned using the second dielectric layer as a mask.

It should be noted that the operations of the method S10, the method S20, and/or the method S30 may be rearranged or otherwise modified within the scope of the various aspects. Additional processes may be provided before, during, and after the method S10, the method S20 and/or the method S30, and some other processes may be only briefly described herein. Thus, other implementations are possible within the scope of the various aspects described herein.

One aspect of the present disclosure provides a method for forming a semiconductor structure. The method may include multiple operations or steps. A first mask layer is formed over a substrate. A photoresist layer is formed over the first mask layer, wherein a photosensitivity of the photoresist layer is different from a photosensitivity of the first mask layer. A first opening penetrating the photoresist layer and the first mask layer and a second opening partially penetrating the photoresist layer are formed, wherein the first mask layer overlapped by the second opening is degraded to form a second mask layer. The substrate exposed by the first opening is partially removed to form a first recess of the substrate. The second mask layer is removed to form a third opening through the first mask layer. A first dielectric layer is formed, wherein the first dielectric layer fills the first recess and the third opening and covers the substrate that is overlapped by the third opening. A patterning operation is performed on the substrate using the first dielectric layer as a mask, and a second recess of the substrate is thereby formed.

In some embodiments, the method further includes: providing the substrate; and defining a plurality of protruding portions and a plurality of recessed portions, wherein each of the plurality of protruding portions and each of the plurality of recessed portions extend along a first direction, and the plurality of protruding portions and the plurality of recessed portions are alternately arranged along a second direction substantially orthogonal to the first direction.

In some embodiments, the plurality of protruding portions include a first protruding portion and a second protruding portion serially arranged along the second direction, an entirety of the first opening is formed penetrating the photoresist layer and the first mask layer and overlaps the first protruding portion, and the second opening is across and over the second protruding portion.

In some embodiments, the plurality of recessed portions include a first recessed portion and a second recessed portion serially arranged along the second direction, and the second opening further overlaps the first recessed portion and the second recessed portion.

In some embodiments, the first recess is offset from the second recess along the second direction.

In some embodiments, the first opening and the second opening are connected to each other.

In some embodiments, the formation of the first opening and the second opening comprises: providing a photomask, including a first pattern and a second pattern, wherein the first pattern and the second pattern include different optical transmission rates; and defining the first opening and the second opening by the first pattern and the second pattern, respectively.

In some embodiments, the first pattern has an optical transmission rate substantially greater than an optical transmission rate of the second pattern.

In some embodiments, the optical transmission rate of the second pattern is $1/10$ to $9/10$ of the optical transmission rate of the first pattern.

In some embodiments, the definition of the first opening and the second opening comprises: performing an exposure operation for the photoresist layer using the photomask, wherein the first mask layer overlapped by the second opening is degraded by the exposure operation; and applying a developer to the photoresist layer.

In some embodiments, the developer removes the first mask layer overlapped by the first opening.

In some embodiments, the photoresist layer includes positive photoresist material.

In some embodiments, the first mask layer includes a positive photosensitive material.

Another aspect of the present disclosure provides a method for manufacturing a semiconductor structure. The method may include multiple operations or steps. A substrate is provided, wherein the substrate includes a first protruding portion and a second protruding portion substantially parallel to each other and extending along a first direction. The first protruding portion and the second protruding portion are covered by a first dielectric layer. A first mask layer is formed over the first dielectric layer, and a photoresist layer is formed over the first mask layer. A patterning operation is performed, wherein a first opening exposing the first dielectric layer is formed in the first mask layer and the photoresist layer over the first protruding portion, and a second opening is formed partially through the photoresist layer over the second protruding portion. A chemical property of the first mask layer overlapped by the second opening is changed during the patterning operation, and a second mask layer overlapped by the second opening is thereby defined. A first recess of the first protruding portion is formed using the photoresist layer as a mask. The second protruding portion not overlapped by the second mask layer is partially removed, and a second recess of the second protruding portion is thereby formed.

In some embodiments, the first opening and the second opening are connected to each other and extend along a second direction substantially orthogonal to the first direction.

In some embodiments, the first opening and the second opening define a wavy sidewall of the photoresist layer.

In some embodiments, a width of the first opening varies along a second direction substantially orthogonal to the first direction, and a width of the second opening varies along the second direction.

In some embodiments, the width of the first opening is substantially equal to or less than the width of the second opening.

In some embodiments, the first opening includes a plurality of first openings, and the width of the second opening is substantially equal to a distance of two adjacent first openings.

In some embodiments, the method further includes: removing the second mask layer after the formation of the first recess, thereby forming a through hole penetrating the first mask layer; removing the first dielectric layer over the second protruding portion; and forming a second dielectric layer over the first protruding region and the second protruding region and filling the first recess and the through hole.

In some embodiments, the method further includes: after the removal of the first dielectric layer, removing the photoresist layer; and removing the second dielectric layer above the first mask layer.

In some embodiments, a cavity defined by the second dielectric layer, the substrate and the first mask layer is formed.

In some embodiments, the second dielectric layer contacts a portion of the substrate exposed by the through hole without filling a cavity between the first mask layer and the substrate.

In some embodiments, the method further includes: forming a first conformal layer lining the first recess, wherein the removal of the first dielectric layer over the second protruding portion includes a high etch rate selectivity of a material of the first dielectric layer to a material of the first conformal layer.

In some embodiments, the method further includes: forming a second conformal layer over the first dielectric layer, the second dielectric layer and the substrate.

In some embodiments, the method further includes: performing a planarization until an exposure of the substrate occurs.

Another aspect of the present disclosure provides a method for manufacturing a semiconductor structure. The method includes a number of operations or steps. A substrate is provided, wherein the substrate includes a first protruding portion and a second protruding portion, wherein the first protruding portion and the second protruding portion extend along a first direction. A patterned photosensitive layer is formed, wherein the patterned photosensitive layer includes a first through hole over the first protruding portion and a recess over the second protruding portion, wherein the first through hole and the recess are connected along a second direction substantially orthogonal to the first direction, and a width of the first through hole is less than a width of the recess. A portion of the substrate exposed by the first through hole is partially removed, and a first opening of the substrate is thereby formed. A first dielectric layer lining the first opening is formed. The patterned photosensitive layer below the recess is partially removed, and a second through hole is thereby formed. A second dielectric layer surrounded by the first dielectric layer and disposed within the second through hole is formed. The substrate is patterned using the second dielectric layer as a mask.

In some embodiments, the patterned photosensitive layer includes a lower sub-layer and an upper sub-layer having different optical sensitivities.

In some embodiments, the recess stops within the upper sub-layer, and a material of a portion of the lower sub-layer is chemically changed during the formation of the patterned photosensitive layer.

In some embodiments, the formation of the patterned photosensitive layer comprises: forming a photosensitive layer over the substrate; and patterning the photosensitive layer using a photomask, including patterns with different optical transmission rates.

In some embodiments, the photomask includes a first pattern and a second pattern, wherein an optical transmission rate of the second pattern is $1/10$ to $9/10$ of an optical transmission rate of the first pattern.

In some embodiments, the first through hole is defined by the first pattern, and the recess is defined by the second pattern.

In some embodiments, the first through hole along the second direction has a dumbbell-like configuration.

In some embodiments, the recess along the second direction has a hexagonal configuration.

In some embodiments, the first protruding portion and the second protruding portion are separated by an isolation, and the recess is further disposed over the isolation.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A method for manufacturing a semiconductor structure, the method comprising:
    forming a first mask layer over a substrate;
    forming a photoresist layer over the first mask layer, wherein a photosensitivity of the photoresist layer is different from a photosensitivity of the first mask layer;
    forming a first opening penetrating the photoresist layer and the first mask layer and a second opening partially penetrating the photoresist layer, wherein the first mask layer overlapped by the second opening is degraded to form a second mask layer;
    partially removing the substrate exposed by the first opening to form a first recess of the substrate;

removing the second mask layer to form a third opening through the first mask layer;

forming a first dielectric layer filling the first recess and the third opening and covering the substrate overlapped by the third opening; and performing a patterning operation on the substrate using the first dielectric layer as a mask, thereby forming a second recess of the substrate.

2. The method of claim 1, further comprising:

providing the substrate; and defining a plurality of protruding portions and a plurality of recessed portions of the substrate, wherein each of the plurality of protruding portions and each of the plurality of recessed portions extend along a first direction, and the plurality of protruding portions and the plurality of recessed portions are alternately arranged along a second direction orthogonal to the first direction.

3. The method of claim 2, wherein the plurality of protruding portions include a first protruding portion and a second protruding portion serially arranged along the second direction, an entirety of the first opening is formed over and overlaps the first protruding portion, and the second opening is across and over the second protruding portion.

4. The method of claim 3, wherein the plurality of recessed portions include a first recessed portion and a second recessed portion serially arranged along the second direction, and the second opening further overlaps the first recessed portion and the second recessed portion.

5. The method of claim 3, wherein the first recess is offset from the second recess along the second direction.

6. The method of claim 1, wherein the first opening and the second opening are connected to each other.

7. The method of claim 1, wherein the first opening and the second opening comprises:

providing a photomask, including a first pattern and a second pattern, wherein the first pattern and the second pattern include different optical transmission rates;

defining the first opening and the second opening by the first pattern and the second pattern, respectively;

wherein the first pattern has an optical transmission rate substantially greater than an optical transmission rate of the second pattern; and wherein the optical transmission rate of the second pattern is $1/10$ to $9/10$ of the optical transmission rate of the first pattern.

8. The method of claim 7, wherein the defined first opening and the second opening comprises:

performing an exposure operation for the photoresist layer using the photomask, wherein the first mask layer overlapped by the second opening is degraded by the exposure operation;

applying a developer to the photoresist layer; and wherein the developer removes the first mask layer overlapped by the first opening.

9. The method of claim 1, wherein the photoresist layer includes a positive photoresist material, and the first mask layer includes a positive photosensitive material.

10. A method for manufacturing a semiconductor structure, the method comprising:

providing a substrate having a first protruding portion and a second protruding portion parallel to each other and extending along a first direction;

covering the first protruding portion and the second protruding portion with a first dielectric layer;

forming a first mask layer over the first dielectric layer, and a photoresist layer over the first mask layer;

performing a patterning operation, wherein a first opening exposing the first dielectric layer is formed in the photoresist layer and the first mask layer and over the first protruding portion, and a second opening is formed partially through the photoresist layer and over the second protruding portion;

changing a chemical property of the first mask layer overlapped by the second opening during the patterning operation, thereby defining a second mask layer overlapped by the second opening;

forming a first recess of the first protruding portion using the photoresist layer as a mask; and partially removing the second protruding portion not overlapped by the second mask layer, thereby forming a second recess of the second protruding portion.

11. The method of claim 10, wherein the first opening and the second opening are connected to each other and extended along a second direction orthogonal to the first direction.

12. The method of claim 10, wherein the first opening and the second opening define a wavy sidewall of the photoresist layer.

13. The method of claim 10, wherein a width of the first opening varies along a second direction orthogonal to the first direction, and a width of the second opening varies along the second direction.

14. The method of claim 10, wherein a width of the first opening is equal to or less than a width of the second opening.

15. The method of claim 10, wherein the first opening is plural, and a width of the second opening is equal to a distance between two adjacent first openings.

16. The method of claim 10, further comprising:

removing the second mask layer after the formation of the first recess, thereby forming a through hole penetrating the first mask layer;

removing the first dielectric layer over the second protruding portion; and forming a second dielectric layer over the first protruding region and the second protruding region and filling the first recess and the through hole.

17. The method of claim 16, further comprising:

after removing the first dielectric layer, removing the photoresist layer; and removing the second dielectric layer above the first mask layer.

18. The method of claim 16, wherein a cavity defined by the second dielectric layer, the substrate and the first mask layer is formed; the second dielectric layer contacts the substrate exposed by the through hole while leaving the cavity between the first mask layer and the substrate partially unfilled.

19. The method of claim 16, further comprising:

forming a first conformal layer lining the first recess, wherein the removal of the first dielectric layer over the second protruding portion includes a high etch rate selectivity of a material of the first dielectric layer to a material of the first conformal layer.

20. The method of claim 16, further comprising:

forming a second conformal layer over the first dielectric layer, the second dielectric layer and the substrate.

* * * * *